United States Patent
Sun et al.

(10) Patent No.: US 11,830,911 B2
(45) Date of Patent: Nov. 28, 2023

(54) SEMICONDUCTOR DEVICE INCLUDING ISOLATION REGIONS

(71) Applicant: SAMSUNG ELECTRONICS CO., LTD., Suwon-si (KR)

(72) Inventors: Min-Chul Sun, Yongin-si (KR); Dae Won Ha, Seoul (KR); Dong Hoon Hwang, Hwaseong-si (KR); Jong Hwa Baek, Yongin-si (KR); Jong Min Jeon, Suwon-si (KR); Seung Mo Ha, Seoul (KR); Kwang Yong Yang, Seoul (KR); Jae Young Park, Yongin-si (KR); Young Su Chung, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/162,892

(22) Filed: Feb. 1, 2023

(65) Prior Publication Data

US 2023/0178595 A1 Jun. 8, 2023

Related U.S. Application Data

(63) Continuation of application No. 17/212,847, filed on Mar. 25, 2021, now Pat. No. 11,575,002, which is a
(Continued)

(30) Foreign Application Priority Data

Sep. 25, 2017 (KR) .................. 10-2017-0123503

(51) Int. Cl.
*H01L 29/06* (2006.01)
*H01L 27/088* (2006.01)
(Continued)

(52) U.S. Cl.
CPC .... *H01L 29/0649* (2013.01); *H01L 21/76224* (2013.01); *H01L 21/823431* (2013.01); *H01L 21/823481* (2013.01); *H01L 27/0886* (2013.01); *H01L 29/41791* (2013.01); *H10B 10/12* (2023.02); *H10B 10/18* (2023.02)

(58) Field of Classification Search
CPC ......... H01L 29/0649; H01L 21/823431; H01L 21/823481; H01L 27/0886; H01L 27/1104; H01L 27/1116; H01L 29/41791; H01L 29/7846; H01L 29/7843; H01L 29/7848; H01L 21/76224–76237; H01L 21/823878

See application file for complete search history.

(56) References Cited

U.S. PATENT DOCUMENTS 7,994,020 B2   8/2011   Lin et al.
8,461,008 B2   6/2013   Cho
(Continued)

*Primary Examiner* — Shahed Ahmed
(74) *Attorney, Agent, or Firm* — Myers Bigel, P.A.

(57) ABSTRACT

A semiconductor device including a device isolation region is provided. The semiconductor device includes first active regions disposed on a substrate, and an isolation region between the active regions. The isolation region includes a first portion formed of a first insulating material, and a second portion formed of a second insulating material, having different characteristics from those of the first insulating material. The first portion is closer to the first active regions than the second portion. The second portion has a bottom surface having a height different from that of a bottom surface of the first portion.

20 Claims, 49 Drawing Sheets

Related U.S. Application Data continuation of application No. 16/715,075, filed on Dec. 16, 2019, now Pat. No. 10,964,782, which is a continuation of application No. 15/933,827, filed on Mar. 23, 2018, now Pat. No. 10,529,801.

(51) Int. Cl.
*H01L 21/8234* (2006.01)
*H01L 21/762* (2006.01)
*H01L 29/417* (2006.01)
*H10B 10/00* (2023.01)

(56) References Cited

U.S. PATENT DOCUMENTS

| | | | |
|---|---|---|---|
| 9,385,123 B2 | 7/2016 | Chen et al. | |
| 9,455,198 B1 | 9/2016 | Yu et al. | |
| 9,564,446 B1 | 2/2017 | Weybright et al. | |
| 9,576,857 B1 | 2/2017 | Xie et al. | |
| 9,589,845 B1 | 3/2017 | Jagannathan et al. | |
| 2003/0127697 A1 | 7/2003 | Ohta et al. | |
| 2006/0220142 A1 | 10/2006 | Tamura | |
| 2007/0196996 A1 | 8/2007 | Han et al. | |
| 2009/0309147 A1* | 12/2009 | Kim | H10B 41/40 257/E21.546 |
| 2010/0072569 A1* | 3/2010 | Han | H01L 21/76229 257/296 |
| 2011/0089526 A1* | 4/2011 | Lee | H01L 21/762 257/E21.546 |
| 2015/0325575 A1 | 11/2015 | Park et al. | |
| 2016/0042964 A1 | 2/2016 | Lo et al. | |
| 2016/0254260 A1 | 9/2016 | Sheen et al. | |
| 2016/0351411 A1 | 12/2016 | Xie et al. | |
| 2017/0005111 A1 | 1/2017 | Verma et al. | |
| 2017/0053835 A1 | 2/2017 | Sung et al. | |
| 2017/0243944 A1 | 8/2017 | Li et al. | |
| 2018/0151414 A1 | 5/2018 | Wu et al. | |
| 2018/0269324 A1* | 9/2018 | Cheng | H01L 27/0886 |
| 2018/0350904 A1* | 12/2018 | Nagai | H01L 21/76224 |

\* cited by examiner

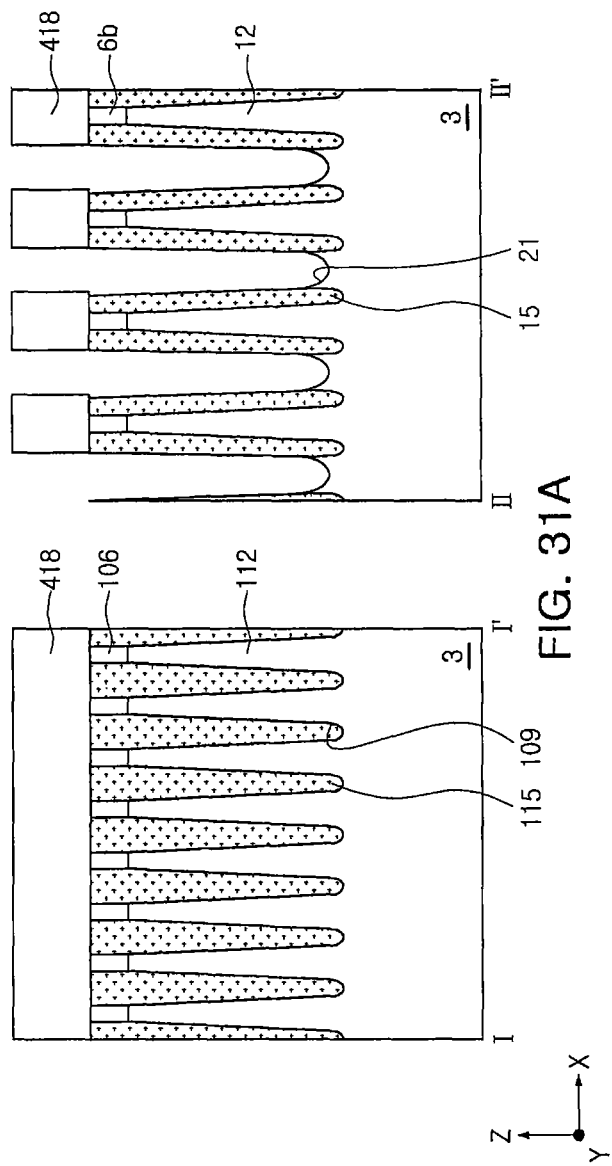

SEMICONDUCTOR DEVICE INCLUDING ISOLATION REGIONS

CROSS-REFERENCE TO RELATED APPLICATION(S)

This application is a continuation of U.S. patent application Ser. No. 17/212,847, filed Mar. 25, 2021, which application is a continuation of U.S. patent application Ser. No. 16/715,075, filed Dec. 16, 2019, which itself is a continuation of U.S. patent application Ser. No. 15/933,827, filed Mar. 23, 2018, now U.S. Pat. No. 10,529,801, which itself claims benefit of priority under 35 U.S.C § 119 to Korean Patent Application No. 10-2017-0123503 filed on Sep. 25, 2017 in the Korean Intellectual Property Office, the disclosures of both of which are hereby incorporated in their entireties by reference.

FIELD OF THE INVENTION

The present inventive concept relates to a semiconductor device, and more particularly, to semiconductor devices including isolation regions, and methods of forming the same.

BACKGROUND

In general, active regions of semiconductor devices are defined by shallow trench isolation (STI). As semiconductor devices have been highly integrated, widths of active regions have gradually been reduced. With such a reduction in active regions, the occurrence of defects in active regions is increasing.

SUMMARY

Some embodiments of the present inventive concept provide a semiconductor device including an isolation region defining an active region.

Some embodiments of the present inventive concept provide a semiconductor device including isolation regions formed of materials having different thermal degeneration characteristics.

Some embodiments of the present inventive concept provide methods of forming the semiconductor device.

According to some embodiments of the present inventive concept, a semiconductor device includes first active regions having first sides arranged in a first direction and second sides arranged in a second direction, perpendicular to the first direction; second active regions having third sides arranged in the first direction and fourth sides arranged in the second direction; a first isolation region adjacent the first and second sides of one of the first active regions; a second isolation region adjacent the third sides of one of the second active regions; and a third isolation region adjacent the fourth sides of one of the second active regions. The first active regions are spaced apart from each other by a first distance in the first direction, the second active regions are spaced apart from each other by a second distance, shorter than the first distance, in the first direction, the first isolation region and the second isolation region each include a first insulating material, and the first isolation region further includes a second insulating material.

According to some embodiments of the present inventive concept, a semiconductor device includes first active regions on a substrate; second active regions on the substrate; a first isolation region between the first active regions; and a second isolation region between the second active regions. The first isolation region and the second isolation region each include a first insulating material, the first isolation region further includes a second insulating material, the first isolation region includes a first portion formed of the first insulating material and a second portion formed of the second insulating material, the first portion is closer than the second portion to one of the first active regions, and the second insulating material is a material different from the first insulating material.

According to some embodiments of the present inventive concept, a semiconductor device includes active regions disposed on a substrate; and an isolation region between the active regions. The isolation region includes a first portion formed of a first insulating material, and a second portion formed of a second insulating material having characteristics different from those of the first insulating material, the first portion is closer than the second portion to one of the active regions, and a bottom surface the second portion has a first height different from a second height of a bottom surface of the first portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Figure 1A:
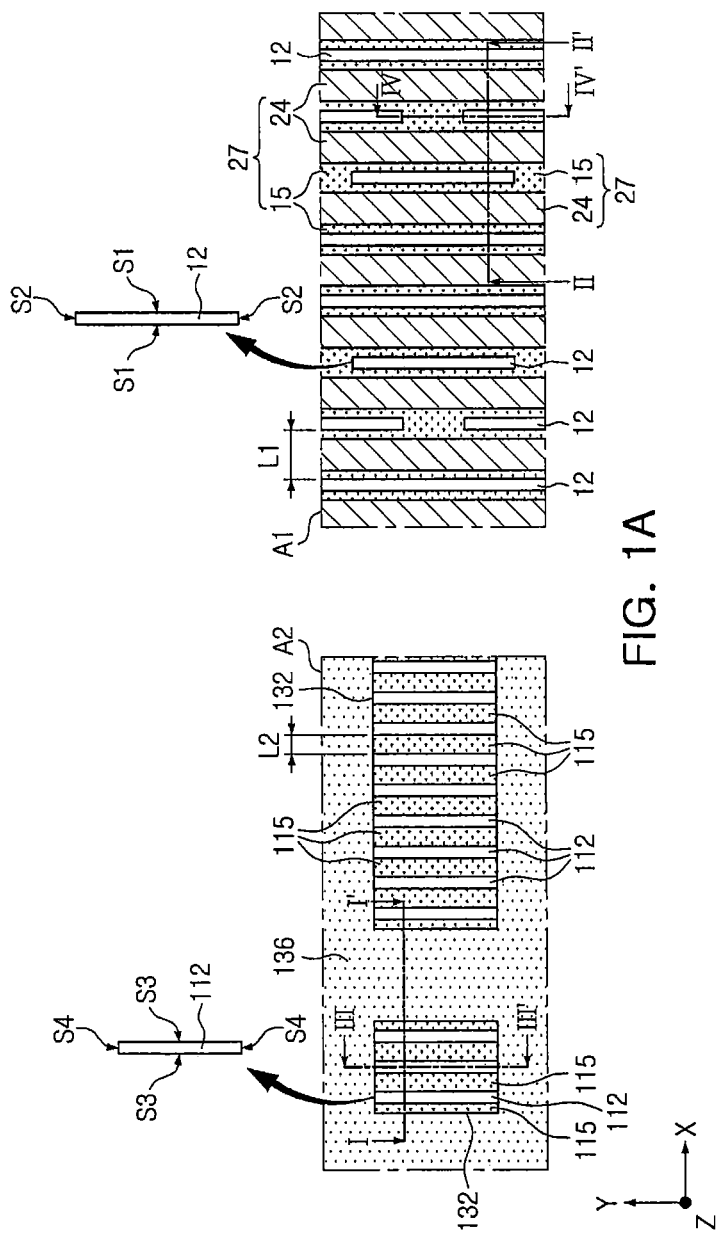
FIGS. 1A and 1B are plan views of an example of a semiconductor device, according to some embodiments of the present inventive concept.
Figure 1B:
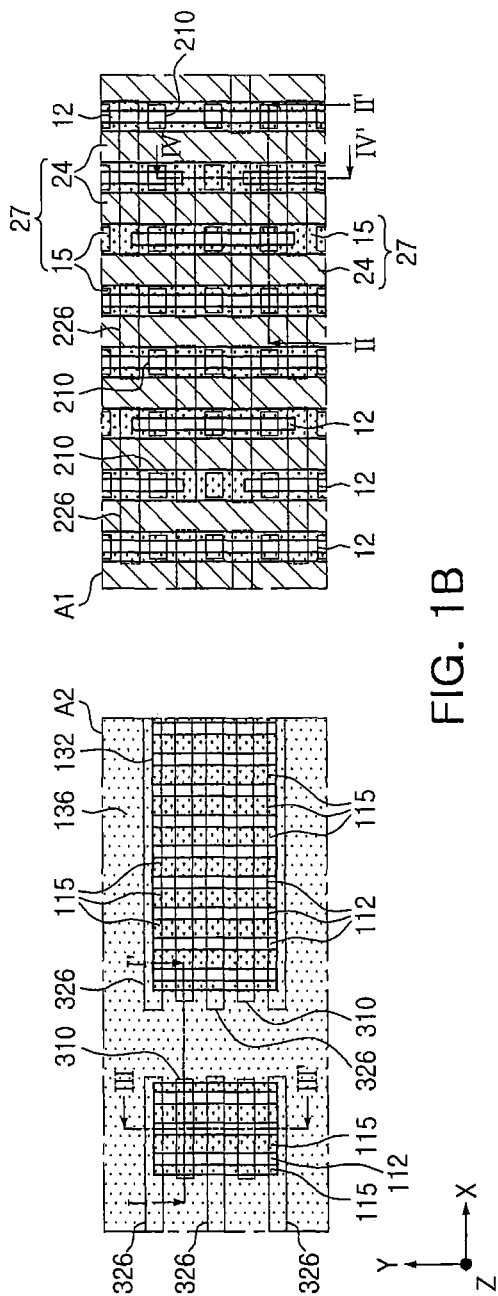
Figure 2A:
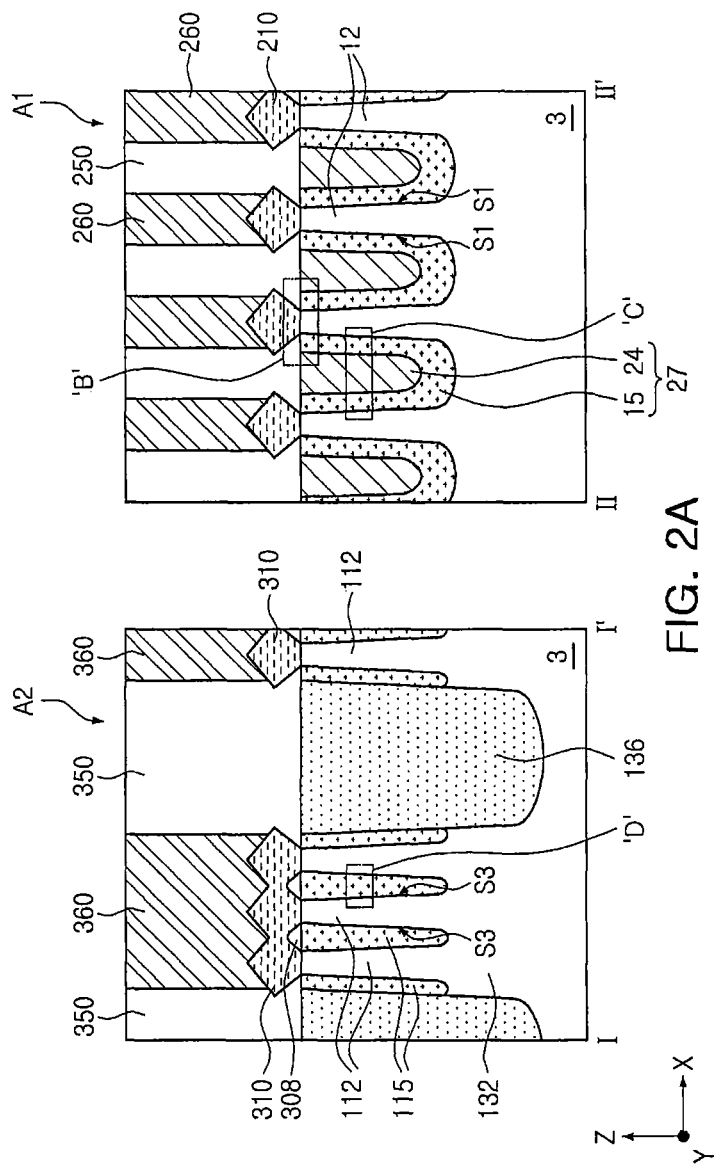
FIGS. 2A and 2B are cross-sectional views of an example of a semiconductor device, according to some embodiments of the present inventive concept.
Figure 2B:
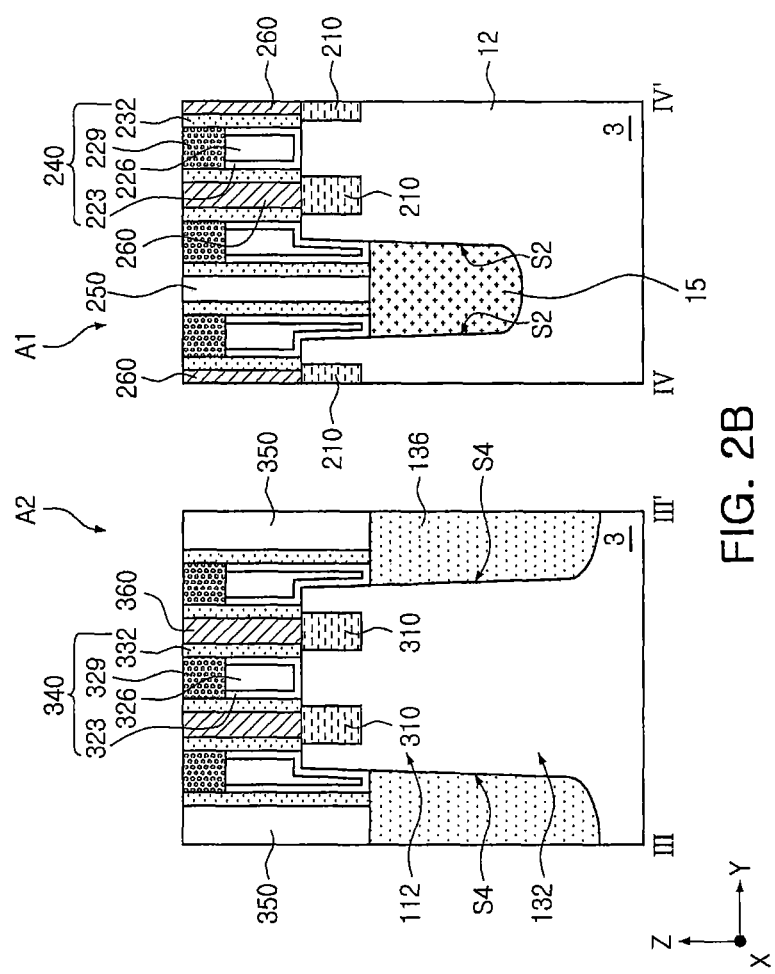

An example of a semiconductor device according to some embodiments will be described with reference to FIGS. 1A, 1B, 2A and 2B. FIGS. 1A and 1B are plan views of a semiconductor device according to an example embodiment. FIG. 2A illustrates cross-sectional views of regions taken on line I-I' and line of FIGS. 1A and 1B, and FIG. 2B illustrates cross-sectional views of regions taken on line and line IV-IV' of FIGS. 1A and 1B.

Referring to FIGS. 1A, 1B, 2A and 2B, a substrate 3 having a first region A1 and a second region A2 may be provided. The substrate 3 may be a semiconductor substrate that may be formed of a semiconductor material such as silicon or the like. The first region A1 may be a first circuit region, and the second region A2 may be a second circuit region. For example, the first region A1 may be a logic circuit region, and the second region A2 may be a static random access memory (SRAM) circuit region.

In the substrate 3, isolation regions may be disposed to define active regions.

The active regions may include first active regions 12 disposed on the first region A1, and active base regions 132 and second active regions 112, disposed on the second region A2.

In the first region A1, the first active regions 12 may extend from the substrate 3 in a vertical direction Z. The vertical direction Z may be a direction perpendicular to an upper surface of the substrate 3.

The first active regions 12 may include first sides S1, arranged in a first direction X, and second sides S2, arranged in a second direction Y, perpendicular to the first direction X. The first active regions 12 may be spaced apart from each other with a first distance L1 therebetween, in the first direction X.

In the second region A2, the active base regions 132 may extend from the substrate 3 in the vertical direction Z.

The second active regions 112 may extend from the active base regions 132 in the vertical direction Z.

The second active regions 112 may include third sides S3 arranged in the first direction X, and fourth sides S4 arranged in the second direction Y.

The second active regions 112 may be spaced apart from each other by a second distance L2, shorter than the first distance L1, in the first direction X. Thus, in the first direction X, the second distance L2 between the second active regions 112 adjacent to each other may be shorter than the first distance L1 between the first active regions 12, adjacent to each other.

A distance between the active base regions 132 may be greater than the first distance L1 between the first active regions 12, adjacent to each other.

The fourth sides S4 of the second active regions 112 may be self-aligned with a side of the active base region 132. The third sides S3 of the second active regions 112 may overlap the active base region 132, and may not be self-aligned with a side of the active base region 132.

The isolation regions may include a first isolation region 27 disposed in the first region A1 of the substrate 3, and a second isolation region 115 and a third isolation region 136, disposed in the second region A2 of the substrate 3.

The first isolation region 27 may define the first active regions 12. The first isolation region 27 may be disposed between the first active regions 12. The first isolation region 27 may face the first sides S1 and the second sides S2 of the first active regions 12.

The first isolation region 27 may include a first portion 15 and a second portion 24. In the first isolation region 27, the first portion 15 may be formed to be closer to the first active regions 12 than the second portion 24 is. The second isolation region 115 may face the third sides S3 of the second active regions 112. The third isolation region 136 may extend upwardly while defining the active base region 132.

The third isolation region 136 may extend upwardly while surrounding a side of the active base region 132, to face the fourth sides S4 of the second active regions 112. The third sides S3 of the second active regions 112 may face the second isolation regions 115, and the fourth sides S4 of the second active regions 112 may face the third isolation region 136. Thus, the second active regions 112 may be defined by the second and third isolation regions 115 and 136. The third isolation region 136 may surround the second active regions 112 and the second isolation region 115 when viewed in plan view.

In some embodiments, the first isolation region 27 and the second isolation region 115 may commonly include a first insulating material. For example, the second isolation region 115 and the first portion 15 of the first isolation region 27 may be formed of the first insulating material. The first isolation region 27 may further include a second insulating material, as compared to the second isolation region 115. For example, the second portion 24 of the first isolation region 27 may be formed of the second insulating material, different from the first insulating material.

In some embodiments, the first insulating material may be a material having etch selectivity with respect to the second insulating material. The first insulating material may be a material having an etching rate higher than that of the second insulating material. The second insulating material may be a material harder than the first insulating material. For example, the first insulating material may be a flowable- CVD oxide or a flowable oxide, and the second insulating material may be a material formed using an atomic layer deposition (ALD) method.

In some embodiments, the first and second insulating materials may have different densities, while being oxide-based materials. For example, the first insulating material may be a flowable-CVD oxide or a flowable oxide, and the second insulating material may be silicon oxide formed by an ALD method.

In some embodiments, the second insulating material may be a material harder or denser than the first insulating material, or may be a material having an etching rate of an oxide etchant lower than an etching rate of the oxide etchant of the first insulating material.

In some embodiments, the first insulating material may be an oxide-based material, and the second insulating material may be a nitride-based material, for example, silicon nitride or silicon oxynitride (SiON).

The third isolation region 136 may include a material different from the first insulating material. For example, the third isolation region 136 may include a third insulating material, different from the first insulating material. The third insulating material may have etch selectivity with respect to the first insulating material. For example, the first insulating material may be a material having a higher etching rate with respect to an oxide etchant than an etching rate of the third insulating material. The third insulating material may be a harder material than the first insulating material. For example, the first insulating material may be a flowable-CVD oxide or a flowable oxide, and the third insulating material may be an a high density plasma (HDP) oxide, a tetraethyl orthosilicate (TEOS) oxide, a undoped silicon glass (USG) oxide, or the like.

In some embodiments, the third insulating material may be a material different from the first and second insulating materials. For example, the first insulating material may be a flowable-CVD oxide or a flowable oxide, the second insulating material may be a silicon oxide, a silicon nitride or a silicon oxynitride formed using an ALD method, and the third insulating material may be HDP oxide, TEOS oxide, USG oxide, or the like.

In the first region A1, first gate structures 240 may be disposed to extend in the first direction X and have portions overlapping the first active regions 12, and first source/drain regions 210 may be disposed to be connected to the first active regions 12 located adjacent to the first gate structures 240.

In the second region A2, second gate structures 340 may be disposed to extend in the first direction X and have portions overlapping the second active regions 112, and second source/drain regions 310 may be disposed to be connected to the second active regions 112 located adjacent to the second gate structures 340.

Each of the first gate structures 240 may include a first gate dielectric 223, a first gate electrode 226, a first gate capping layer 229 and a first gate spacer 232.

The first gate capping layer 229 may be disposed on the first gate electrode 226. The first gate spacer 232 may be disposed on sides of the first gate electrode 226 and the first gate capping layer 229. The first gate dielectric 223 may be disposed between the first gate electrode 226 and the first active regions 12, and may extend between the first gate electrode 226 and the first gate spacer 232.

Each of the second gate structures 340 may include a second gate dielectric 323, a second gate electrode 326, a second gate capping layer 329, and a second gate spacer 332. The second gate capping layer 329 may be disposed on the second gate electrode 326. The second gate spacer 332 may be disposed on sides of the second gate electrode 326 and the second gate capping layer 329. The second gate dielectric 323 may be disposed between the second gate electrode 326 and the second active regions 112, and may extend between the second gate electrode 326 and the second gate spacer 332.

First contact plugs 260 may be disposed on the first source/drain regions 210, and second contact plugs 360 may be disposed on the second source/drain regions 310. Interlayer insulation layers 250 and 350 may be disposed on the first and third isolation regions 27 and 136, respectively.

In an example, in the second source/drain regions 310, adjacent second source/drain regions 310 may be connected to each other. An empty space 308 may be formed between the second source/drain regions 310 connected to each other and the second isolation region 115. The empty space 308 may comprise an air gap or other area that is void of material.

In some embodiments, the first isolation region 27 may include a first portion 15 and a second portion 24, and the first portion 15 may surround a side surface and a bottom surface of the second portion 24. However, the technical idea of the present inventive concept is not limited thereto. Modifications of the first isolation region 27 will be described with reference to FIGS. 3, 4, 5 and 6. FIGS. 3, 4, 5 and 6 are cross-sectional views of regions taken along lines I-I' and II-II' of FIGS. 1A and 1B.

Figure 3:
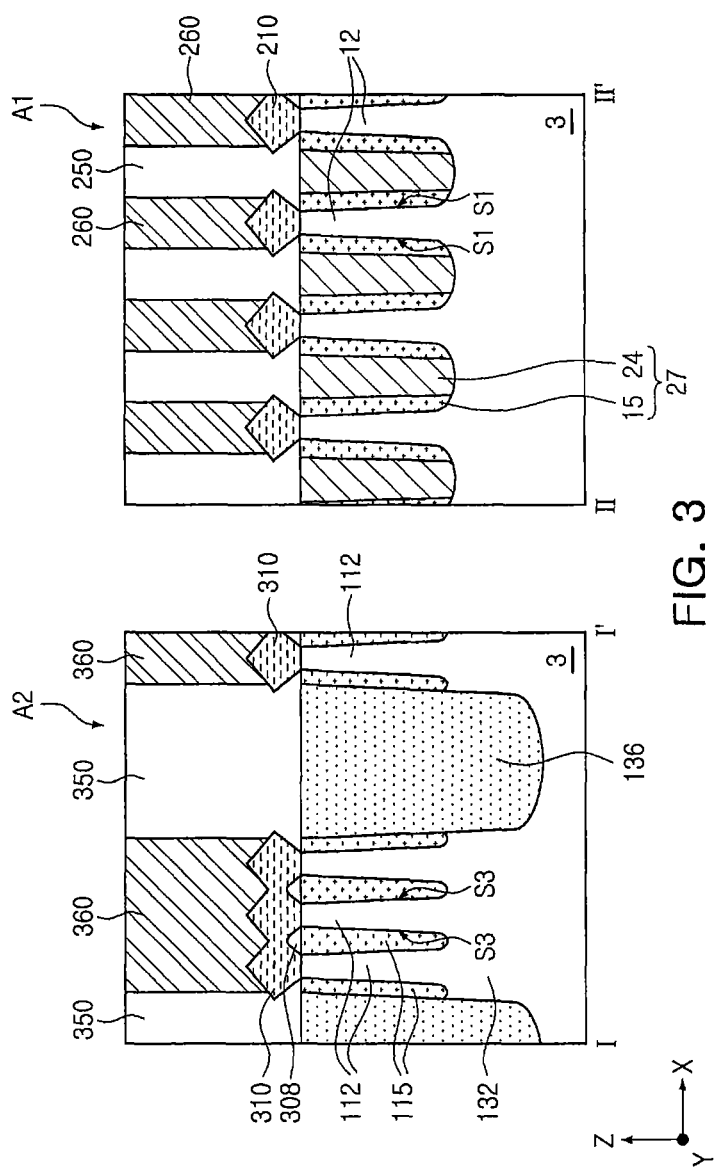
FIG. 3 is a cross-sectional view of a modified example of the semiconductor device, according to some embodiments of the present inventive concept.

With reference to FIG. 3, the first isolation region 27 may include a first portion 15 and a second portion 24. The second portion 24 may be modified to penetrate through the first portion 15.

Figure 4:
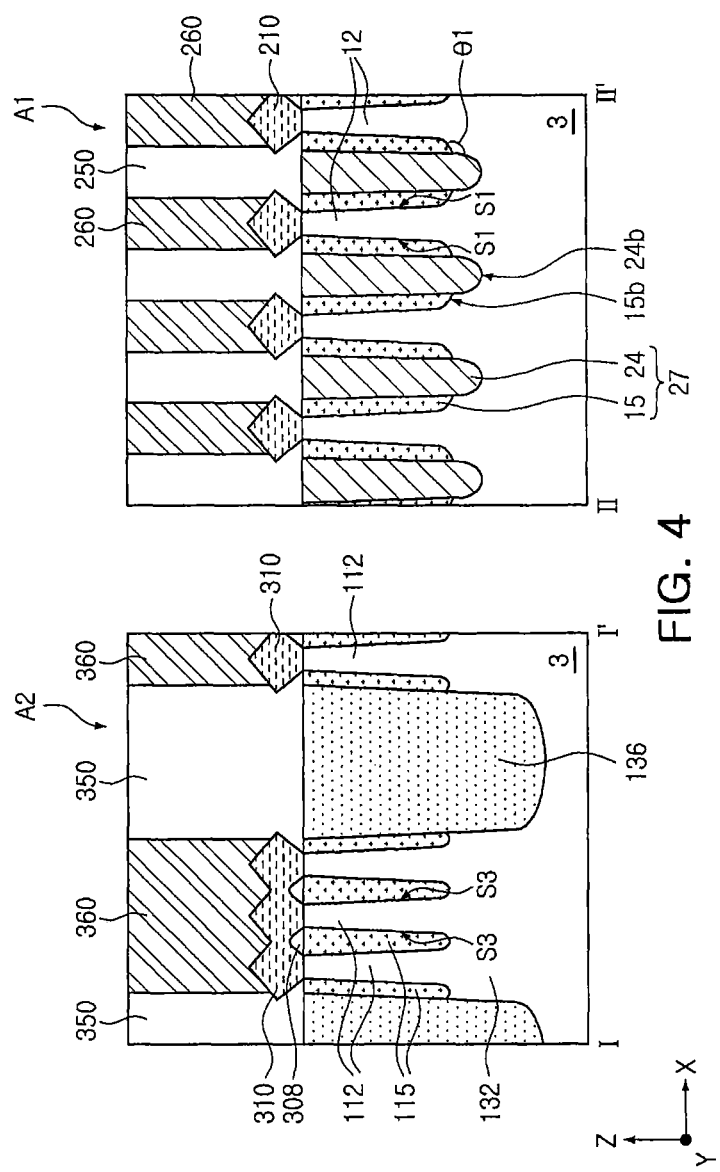
FIG. 4 is a cross-sectional view of a modified example of the semiconductor device, according to some embodiments of the present inventive concept.

With reference to FIG. 4, the first isolation region 27 may include a first portion 15 and a second portion 24, and the second portion 24 may penetrate through the first portion 15 and may be modified to extend into the substrate 3. The first portion 15 may have a downwardly convex bottom surface 15b, and the second portion 24 may penetrate through the bottom surface 15b of the first portion 15. The bottom surfaces 15b of regions of the first portion 15, separated by the second portion 24 and located on both sides of the second portion 24, may have a form lowered in a direction toward the second portion 24.

In some embodiments, the bottom surface 15b of the first portion 15 and a bottom surface 24b of the second portion 24 may form an obtuse angle θ1.

Figure 5:
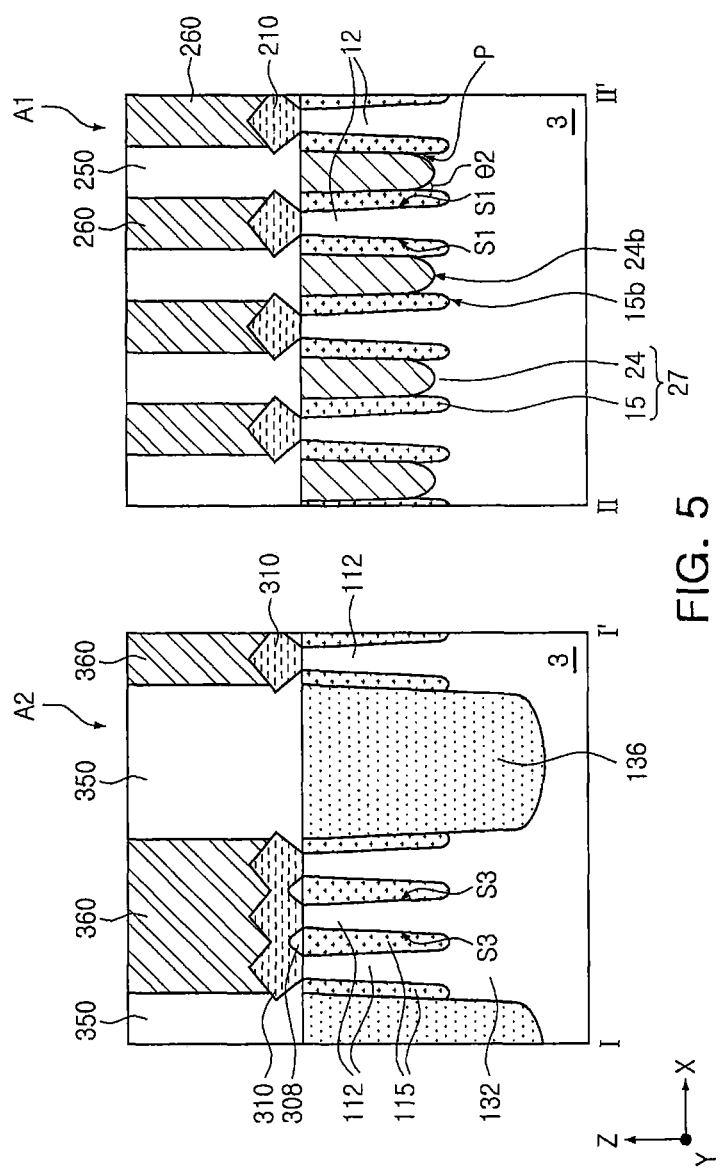
FIG. 5 is a cross-sectional view of a modified example of the semiconductor device, according to some embodiments of the present inventive concept.

Referring to FIG. 5, the first isolation region 27 may include a first portion 15 and a second portion 24, and a bottom surface of the second portion 24 may be disposed on a level higher than that of a bottom surface of the first portion 15. In an example, a bottom surface 15b of the first portion 15 may be downwardly convex, and a bottom surface 24b of the second portion 24 may be downwardly convex.

The first portion 15 located on both sides of the second portion 24 may be downwardly convex. Thus, a protrusion P protruding from the substrate 3 may be disposed between the bottom surface 15b of the first portion 15 and the bottom surface 24b of the second portion 24.

In an example, the bottom surface 15b of the first portion 15 and the bottom surface 24b of the second portion 24 may form an acute angle θ2.

Figure 6:
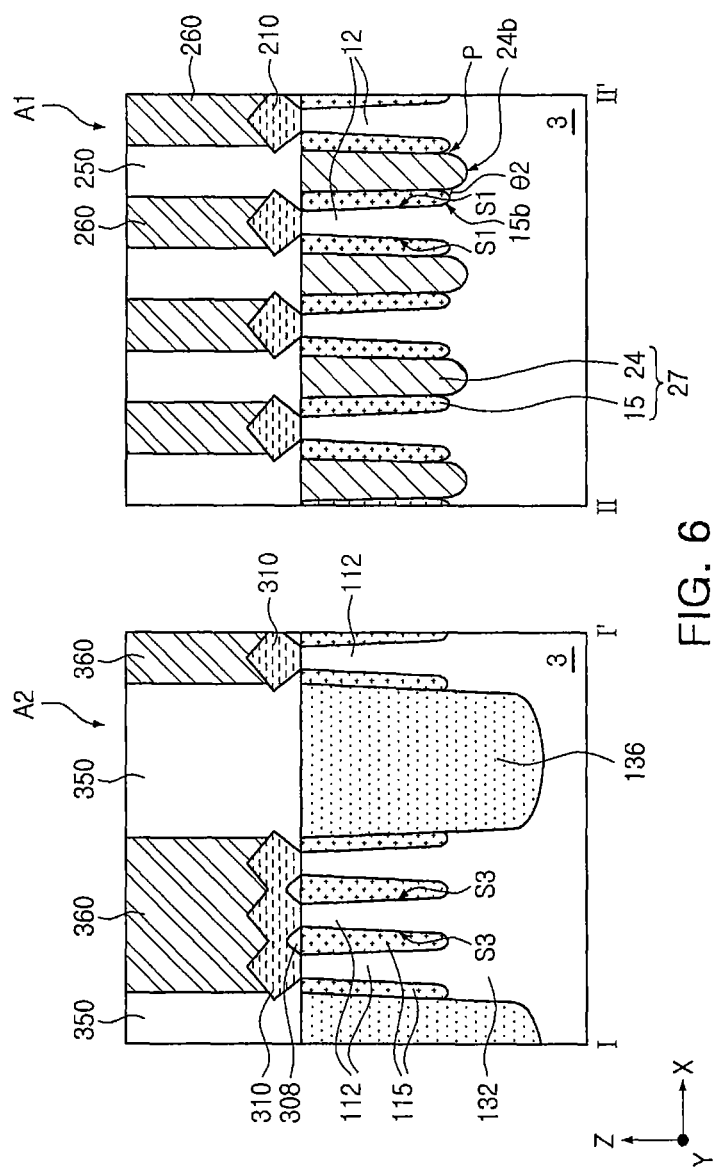
FIG. 6 is a cross-sectional view of a modified example of the semiconductor device, according to some embodiments of the present inventive concept.

With reference to FIG. 6, the first isolation region 27 may include a first portion 15 and a second portion 24, and the second portion 24 may extend into the substrate 3 while penetrating through the first portion 15. Bottom surfaces 15b of regions of the first portion 15, separated by the second portion 24 and located on both sides of the second portion 24, may respectively be downwardly convex. In an example, the bottom surface 15b of the first portion 15 and the bottom surface 24b of the second portion 24 may form an acute angle θ2.

Figure 7:
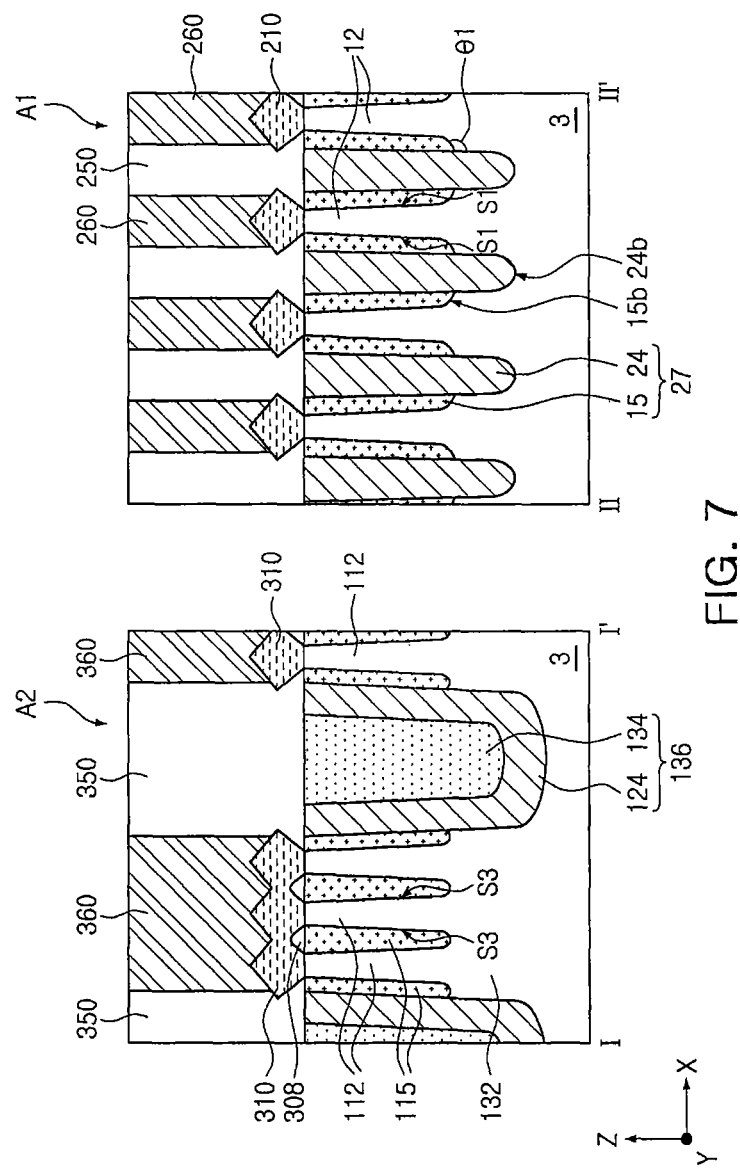
FIG. 7 is a cross-sectional view of a modified example of the semiconductor device, according to some embodiments of the present inventive concept.
Figure 8:
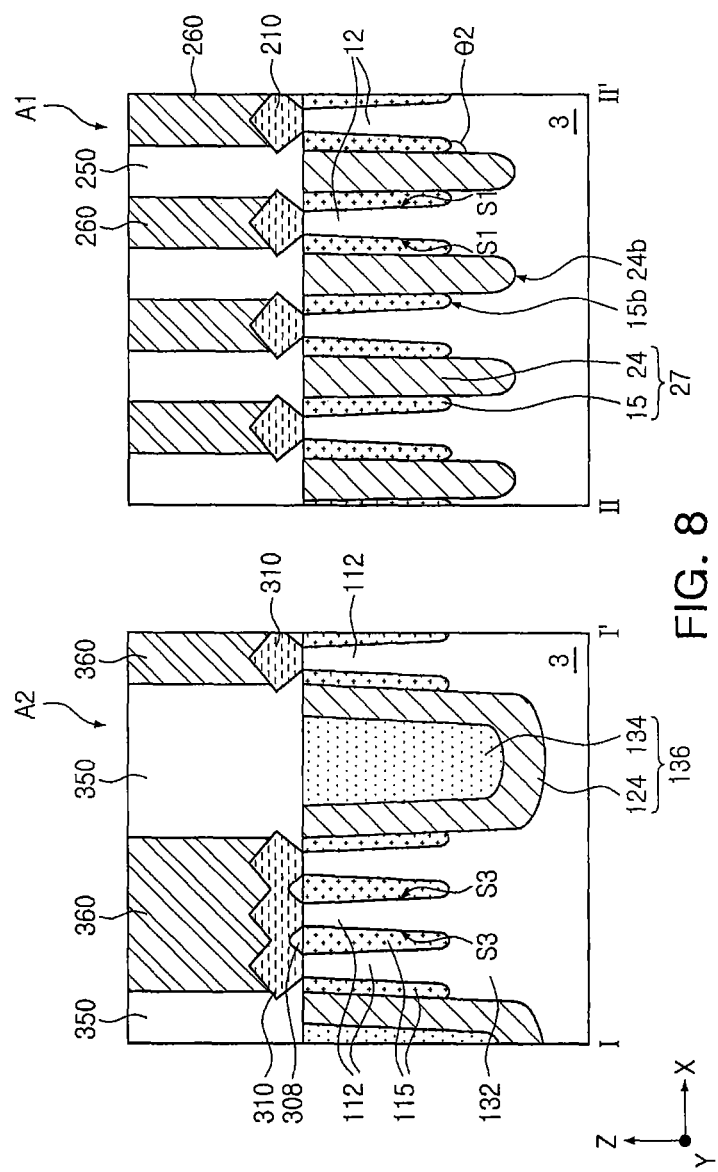
FIG. 8 is a cross-sectional view of a modified example of the semiconductor device, according to some embodiments of the present inventive concept.

Referring again to FIGS. 1A, 1B, 2A and 2B, the third isolation region 136 may be formed of the third insulating material, but a material thereof is not limited thereto. A modified example of the third isolation region 136 and a modified example of the first isolation region 27 will be described with reference to FIGS. 7 and 8, respectively. FIGS. 7 and 8 are cross-sectional views of regions taken along lines I-I' and II-II' of FIGS. 1A and 1B.

Referring to FIG. 7, the third isolation region 136 may be modified to include a first portion 124 and a second portion 134. In the modified third isolation region 136 as described above, the first portion 124 of the third isolation region 136 may surround a side surface and a bottom surface of the second portion 134 of the third isolation region 136.

The first isolation region 27 may include a first portion 15 and a second portion 24, and the second portion 24 of the first isolation region 27 may penetrate through the first portion 15 of the first isolation region 27, and may be modified to extend into the substrate 3. A bottom surface 24b of the second portion 24 of the first isolation region 27 and a bottom surface 15b of the first portion 15 of the first isolation region 27 may form an obtuse angle θ1.

The first portion 15 of the first isolation region 27 and a second isolation region 115 may be formed of the first insulating material, the second portion 24 of the first isolation region 27 and the first portion 124 of the third isolation region 136 may be formed of the same second insulating material, and the second portion 134 of the third isolation region 136 may be formed of the third insulating material.

Referring to FIG. 8, the third isolation region 136 may include a first portion 124 and a second portion 134, identical to those described in FIG. 7.

The first isolation region 27 may include a first portion 15 and a second portion 24. The first portion 15 of the first isolation region 27 may have a downwardly convex bottom surface 15b, and the second portion 24 of the first isolation region 27 may penetrate through the first portion 15 of the first isolation region 27 and extend into the substrate 3.

A bottom surface 24b of the second portion 24 of the first isolation region 27 and a bottom surface 15b of the first portion 15 of the first isolation region 27 may form an acute angle θ2.

Figure 9A:
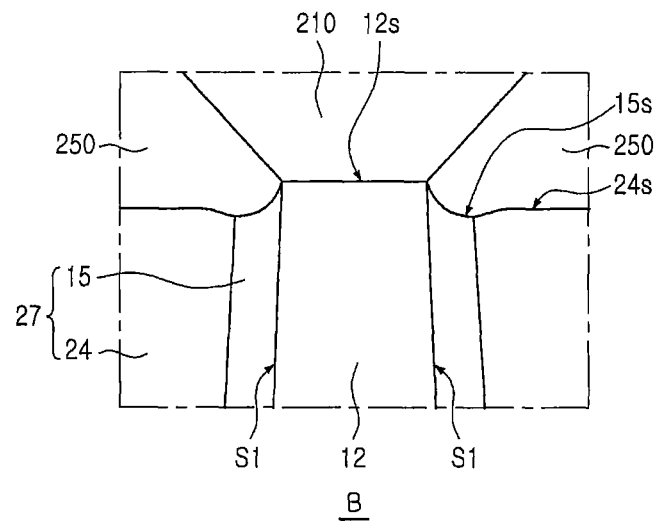
FIG. 9A is a partially enlarged view of an example of a semiconductor device, according to some embodiments of the present inventive concept.
Figure 9B:
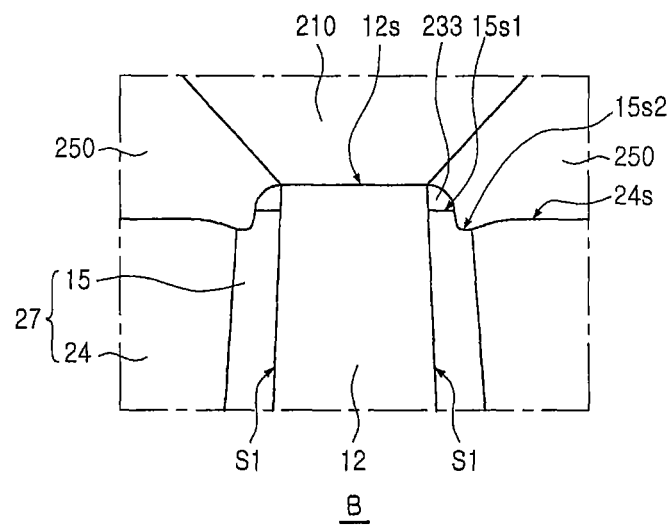
FIG. 9B is a partially enlarged view of a modified example of the semiconductor device, according to some embodiments of the present inventive concept.
Figure 9C:
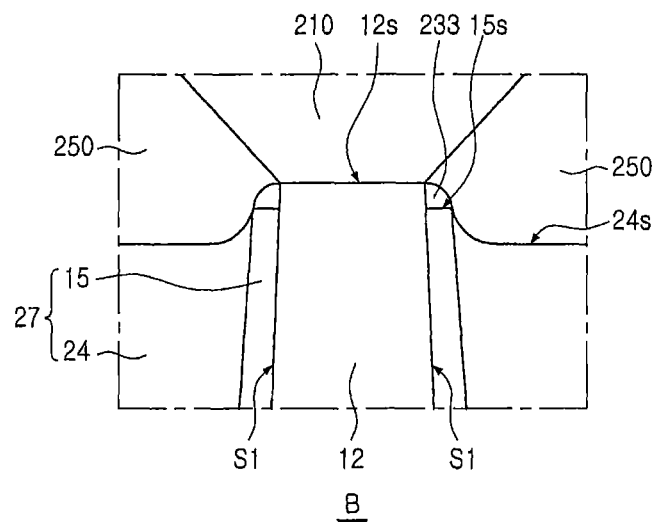
FIG. 9C is a partially enlarged view of a modified example of the semiconductor device, according to some embodiments of the present inventive concept.

Next, some embodiments of the first isolation region 27 according to an example embodiment will be described with reference to FIGS. 9A, 9B, and 9C, respectively. FIGS. 9A, 9B and 9C are partially enlarged views of portion B of FIG. 2A.

Examples of the first isolation region 27 will be described with reference to FIGS. 9A, 9B and 9C, together with the descriptions above with respect to FIGS. 1A to 8. Thus, the following descriptions with reference to FIGS. 9A, 9B and 9C can be understood in conjunction with the contents and components described above with reference to FIGS. 1 to 8, even without separate descriptions below.

Referring to FIG. 9A, the first isolation region 27 may include a first portion 15 and a second portion 24, as described above. The first portion 15 may be formed to be closer to a first active region 12 than the second portion 24 is.

The first isolation region 27 may have an upper surface disposed on a level lower than that of an upper surface 12s of the first active region 12. In an example, the upper surface of the first isolation region 27 may include a first surface 15s and a second surface 24s disposed on a level higher than that of the first surface 15s. The first surface 15s of the upper surface of the first isolation region 27 may be an upper surface of a portion of the first portion 15 close to the second portion 24.

Referring to FIG. 9B, an insulating spacer 233 may be disposed between the first isolation region 27 and the first source/drain region 210. Thus, the first isolation region 27 and the first source/drain region 210 may be spaced apart by the insulating spacer 233.

In some embodiments, the insulating spacer 233 may be formed of the same material as the first and second gate spacers 232 and 332.

In some embodiments, the insulating spacer 233 may cover a portion 15s1 of the upper surface of the first portion 15, and may not cover a remaining portion 15s2 of the upper surface of the first portion 15.

In some embodiments, the portion 15s1 of the upper surface of the first portion 15, covered by the insulating spacer 233, may be disposed on a level higher than that of the upper surface 24s of the second portion 24, and the remaining portion 15s2 of the upper surface of the first portion 15, not covered by the insulating spacer 233, may be disposed on a level lower than that of the upper surface 24s of the second portion 24.

Referring to FIG. 9C, an insulating spacer 233 may be disposed between the first isolation region 27 and the first source/drain region 210, and the insulating spacer 233 may cover an upper surface 15s of the first portion of the first isolation region 27. The upper surface 15s of the first portion 15, covered by the first insulating spacer 233, may be disposed on a level higher than that of an upper surface 24s of the second portion 24.

Figure 9D:
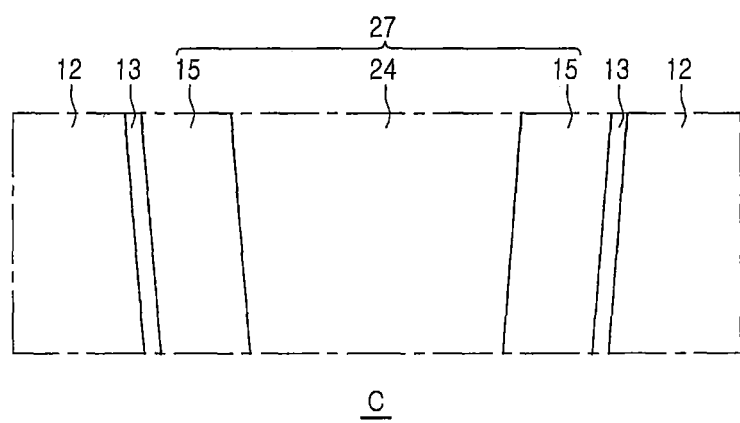
FIGS. 9D and 9E are partially enlarged views of a modified example of the semiconductor device, according to some embodiments of the present inventive concept.
Figure 9E:
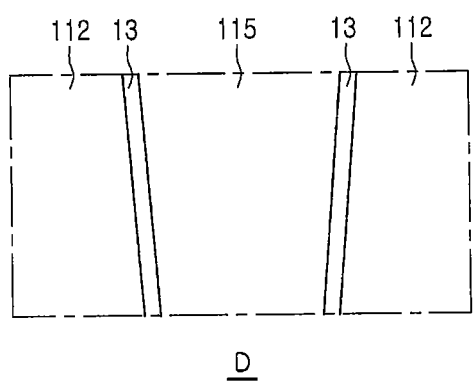

Subsequently, a modified example of the semiconductor device according to some embodiments will be described with reference to FIGS. 9D and 9E. FIGS. 9D and 9E are partially enlarged views of portion B of FIG. 2A. Hereinafter, FIG. 9D and FIG. 9E will be described in conjunction with the contents and components described above with reference to FIGS. 1 to 9C without any separate descriptions.

Referring to FIGS. 9D and 9E, a buffer oxide 13 may be formed between the first isolation region 27 and first active regions 12 and/or between the second isolation region 115 and second active regions 112. The buffer oxide 113 may be formed by a thermal oxidation process performed to prevent an etching damage on surfaces of the first and second active regions 12 and 112, that may occur due to an etching process performed to form the first and second active regions 12 and 112. For example, the buffer oxide 113 may be thermal oxide that may be formed in a thermal oxidation process.

Referring again to FIGS. 1A, 1B, 2A and 2B, in the first isolation region 27 including the first portion 15 and the second portion 24, the second portion 24 may have a linear shape in which a plurality of second portions are disposed to be spaced apart from each other, but the shape of the second portion is not limited thereto. Modifications of the first isolation region 27 will be described with reference to FIGS. 11A, 11B and 11C together with FIG. 10. FIGS. 11A, 11B and 11C are cross-sectional views of regions taken along lines IV-IV' of FIGS. 1A and 1B.

Figure 10:
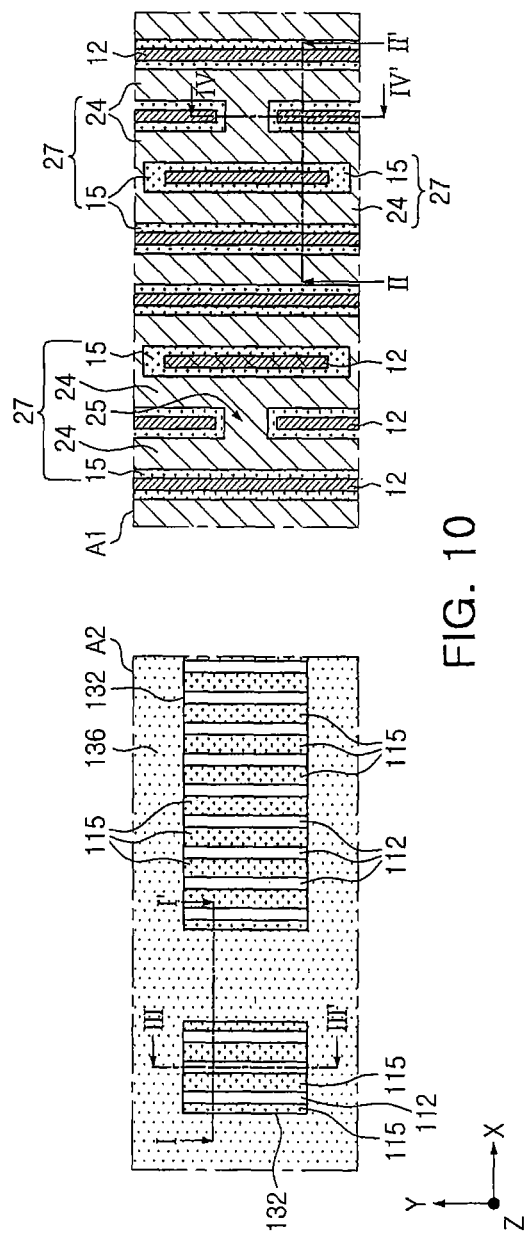
FIG. 10 is a plan view of a modified example of the semiconductor device, according to some embodiments of the present inventive concept.
Figure 11A:
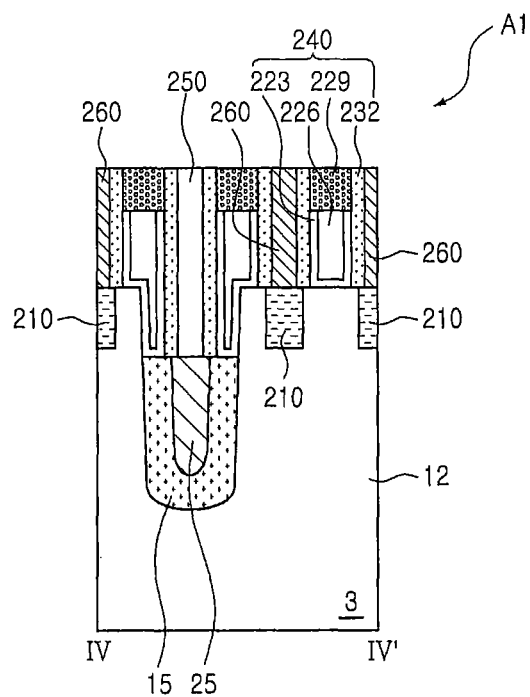
FIG. 11A is a cross-sectional view of a modified example of the semiconductor device, according to some embodiments of the present inventive concept.
Figure 11B:
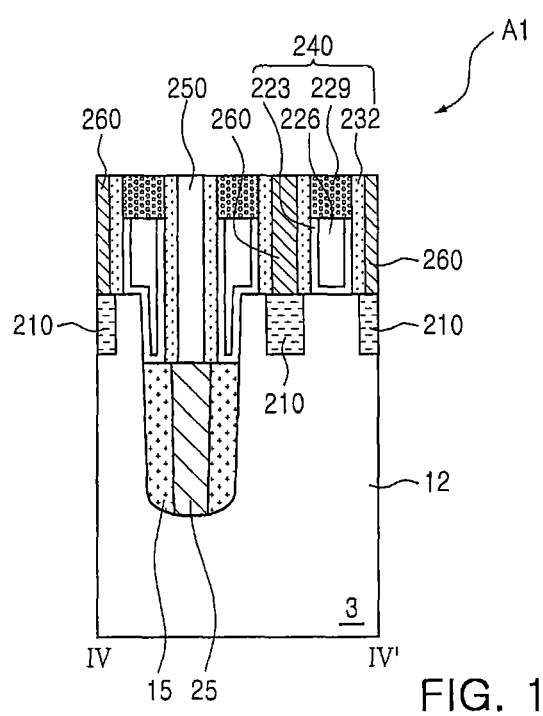
FIG. 11B is a cross-sectional view of a modified example of the semiconductor device, according to some embodiments of the present inventive concept.
Figure 11C:
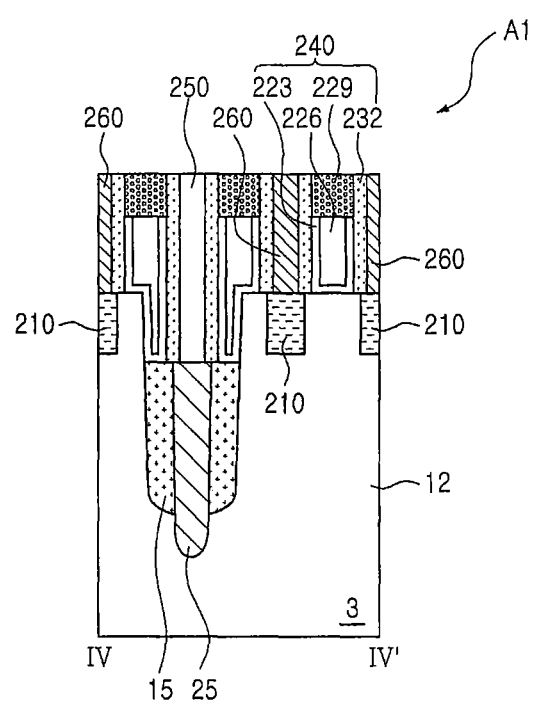
FIG. 11C is a cross-sectional view of a modified example of the semiconductor device, according to some embodiments of the present inventive concept.

Referring to FIGS. 10 and 11A, the first isolation region 27 including first and second portions 15 and 24 may further include a connecting portion 25 extending from one side of the second portion 24 in the first direction X to be connected to a neighboring second portion 24. Thus, in the first isolation region 27, the connecting portion 25 may extend from the second portion 24 and may be formed of the same second insulating material as the second portion 24. The second portion 24 and the connecting portion 25 may be integrally formed.

In an example, when the side and bottom surfaces of the second portion 24 are surrounded by the first portion 15, as illustrated in FIG. 2A, a side surface and a bottom surface of the connecting portion 25 may be surrounded by the first portion 15.

In a modified example, when the second portion 24 penetrates through the first portion 15 as illustrated in FIG. 3, the connecting portion 25 may also penetrate through the first portion 15 as illustrated in FIG. 11B.

In another modification, in a similar case as illustrated in FIG. 4, in which the second portion 24 extends into the substrate 3 while penetrating through the first portion 15, the connecting portion 25 may also extend into the substrate 3 while penetrating through the first portion 15 as illustrated in FIG. 11C.

Hereinafter, various methods in which the foregoing semiconductor devices may be formed will be described with reference to FIGS. 12 to 37. FIGS. 12 to 23 are views of illustrative examples of a method of forming a semiconductor device according to some embodiments, FIGS. 24A to 28 are views of a modified example of the method of forming a semiconductor device according to an example embodiment, FIGS. 29A to 32 are views of a modified example of the method of forming a semiconductor device according to some embodiments, and FIGS. 33 to 37 are views of a modified example of the method of forming a semiconductor device according to some embodiments.

First, referring to FIGS. 12 to 23, illustrative examples of a method of forming a semiconductor device according to example embodiments will be described. In FIGS. 12 to 23, FIGS. 12, 14, FIGS. 16A and 20 are plan views of an example of a method of forming a semiconductor device according to some embodiments, and FIGS. 13, 15, 17, 18A, 19, 21A, 21B, 22 and 23 are cross-sectional views of regions taken along lines I-I' and II-II' of FIGS. 12, 14, 16A and 20. FIG. 16B is a plan view of a modified example of the method of forming a semiconductor device according to some embodiments, FIG. 18B is a cross-sectional view of a modified example of the method of forming a semiconductor device according to some embodiments, and FIG. 18C is a cross-sectional view of a modified example of the method of forming a semiconductor device according to some embodiments.

Figure 12:
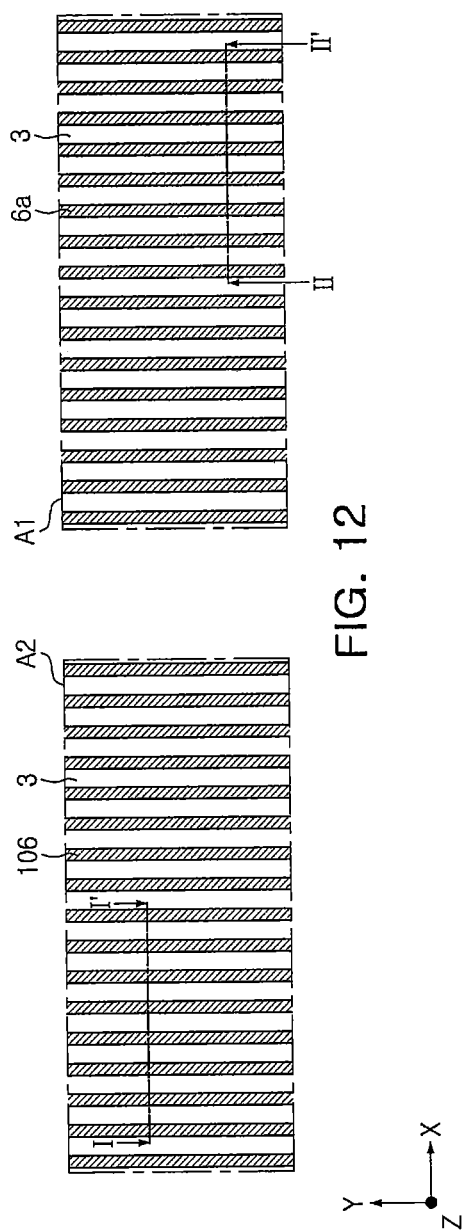
FIGS. 12 to 23 are views of an example of a method of forming a semiconductor device, according to some embodiments of the present inventive concept.
Figure 13:
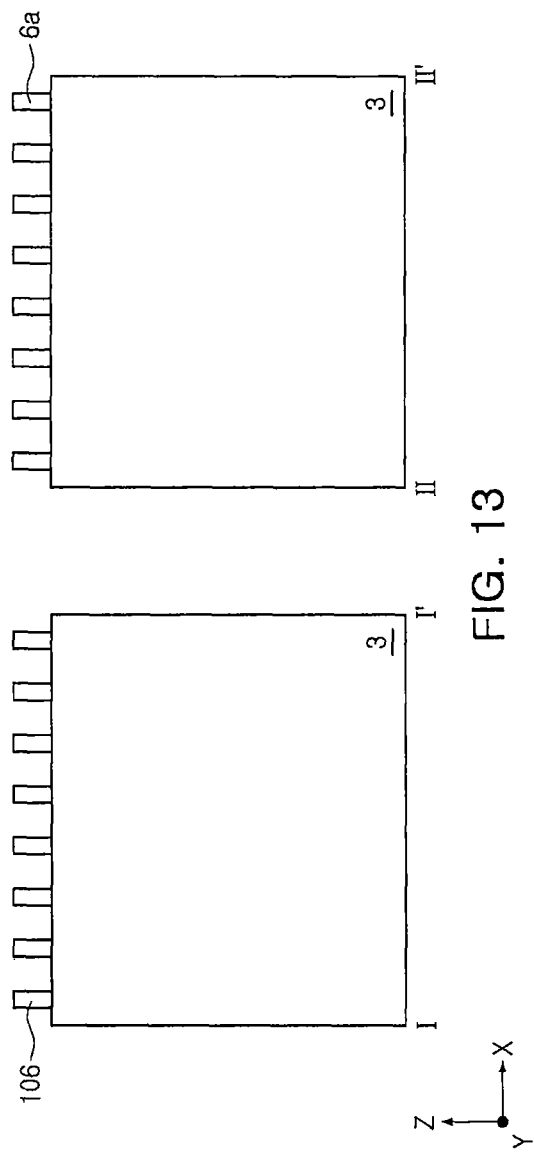

First with reference to FIGS. 12 and 13, hard masks may be formed on a substrate 3 having a first region A1 and a second region A2. The first region A1 may be a first circuit region, and the second region A2 may be a second circuit region. For example, the first region A1 may be a logic circuit region, and the second region A2 may be an SRAM circuit region. The substrate 3 may be a semiconductor substrate that may be formed of a semiconductor material such as silicon or the like.

The hard masks may be formed of a material, such as silicon nitride and/or silicon oxide, or the like. The hard masks may include first hard masks 6a formed on the first region A1, and second hard masks 106 formed on the second region A2.

The first and second hard masks 6a and 106 may be arranged to have a constant interval therebetween in a first direction X. The first and second hard masks 6a and 106 may have a linear shape extending in a second direction Y, perpendicular to the first direction X.

Figure 14:
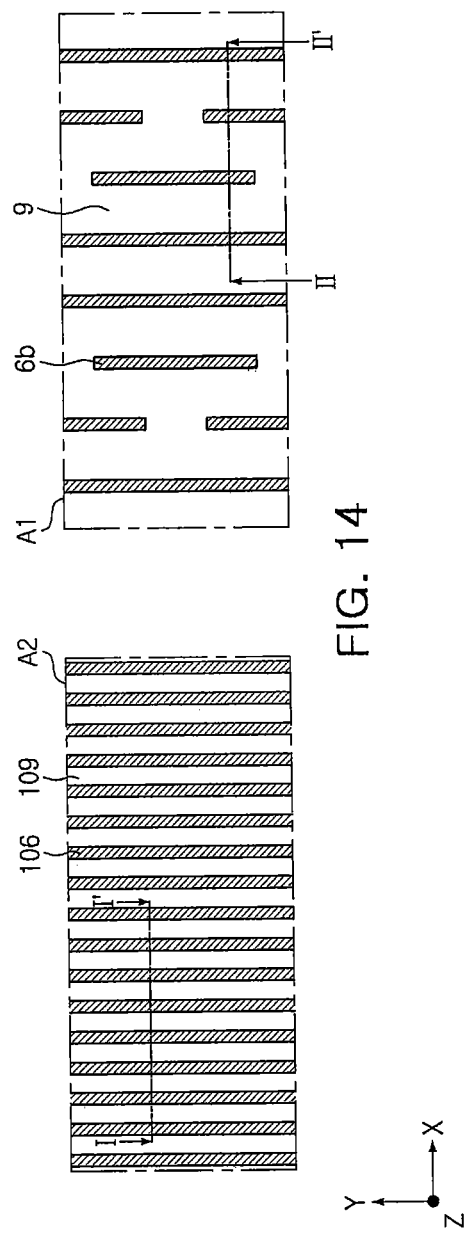
Figure 15:
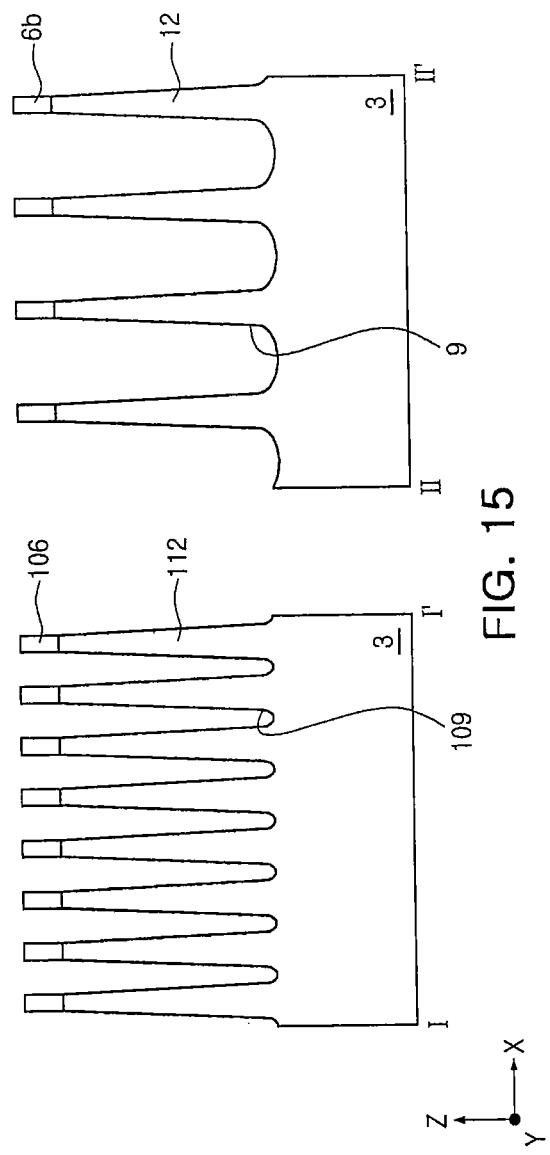

Referring to FIGS. 14 and 15, portions of the first hard masks (see 6a of FIG. 12) may be patterned and removed. Thus, first hard masks 6b formed by patterning the portions of the first hard masks (6a of FIG. 12) may be provided.

An interval between the patterned first hard masks 6b arranged in the first direction X may be greater than an interval between the second hard masks 106 arranged in the first direction X.

The substrate 3 may be etched in an etching process in which the first and second hard masks 6b and 106 are used as etching masks, to form first and second trenches 9 and 109, while forming first and second active regions 12 and 112 remaining below the first and second hard masks 6b and 106.

Of the first and second trenches 9 and 109, the first trenches 9 may be formed on the first region A1, to define the first active regions 12, and the second trenches 109 may be formed on the second region A2, to define the second active regions 112. The interval between the first active regions 12 arranged in the first direction X may be greater than the interval between the second active regions 112 arranged in the first direction X.

Figure 16A:
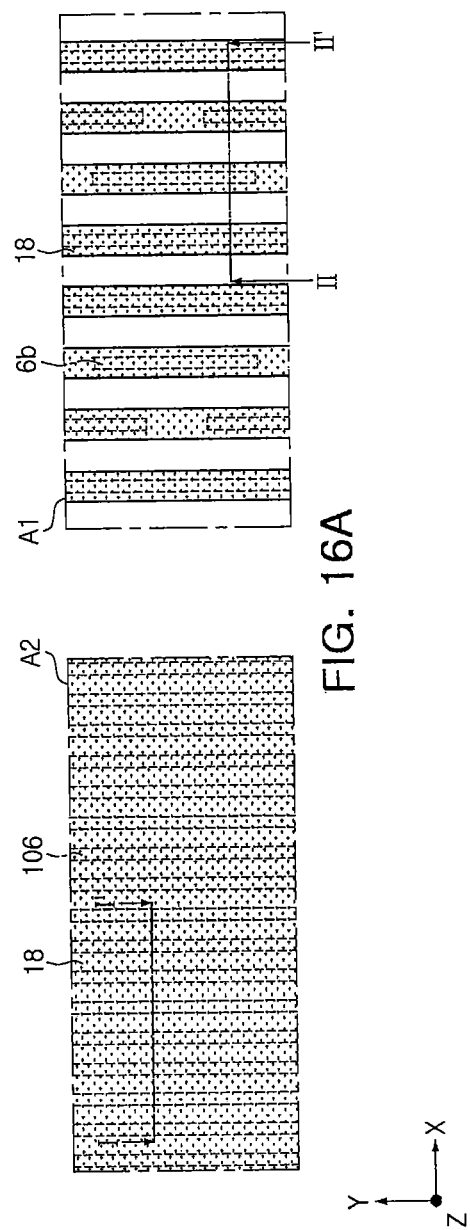
Figure 17:
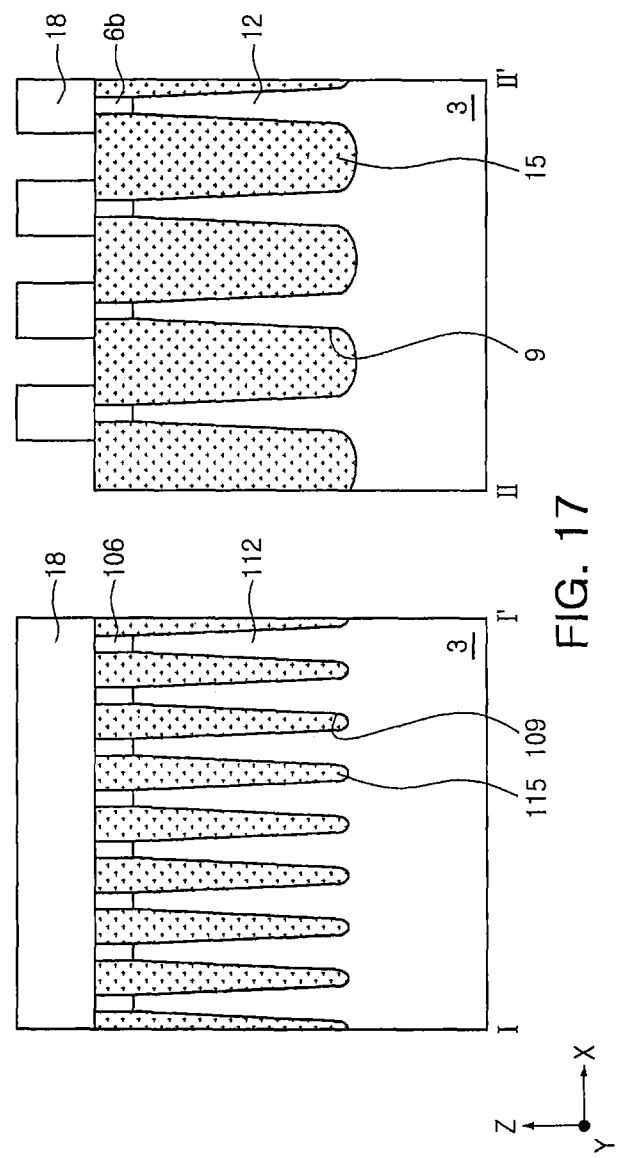

Referring to FIGS. 16A and 17, a first preliminary isolation region 15 may be formed in the first trenches 9, and a second isolation region 115 may be formed in the second trenches 109.

Forming the first preliminary isolation region 15 and the second isolation region 115 may include forming a first insulating material on a substrate having the trenches 9 and 109, and planarizing the first insulating material until the first and second hard masks 6b and 106 are exposed. The first preliminary isolation region 15 and the second isolation region 115 may be formed of the same first insulating material.

A first photoresist pattern 18 may be formed on the substrate having the first preliminary isolation region 15 and the second isolation region 115.

The first photoresist pattern 18 may expose a portion of the first region A1, while covering the entirety of the second region A2. On the first region A1, the first photoresist pattern 18 may be formed to cover the first hard masks 6b while having a larger size than the first hard masks 6b. Thus, the first photoresist pattern 18 may cover the entirety of the second region A2, and may cover the first hard masks 6b of the first region A1 while exposing portions of the first preliminary isolation regions 15 of the first region A1.

In some embodiments, in the case of the first photoresist pattern 18, portions thereof formed on the first region A1 may have linear shapes spaced apart from each other.

Figure 16B:
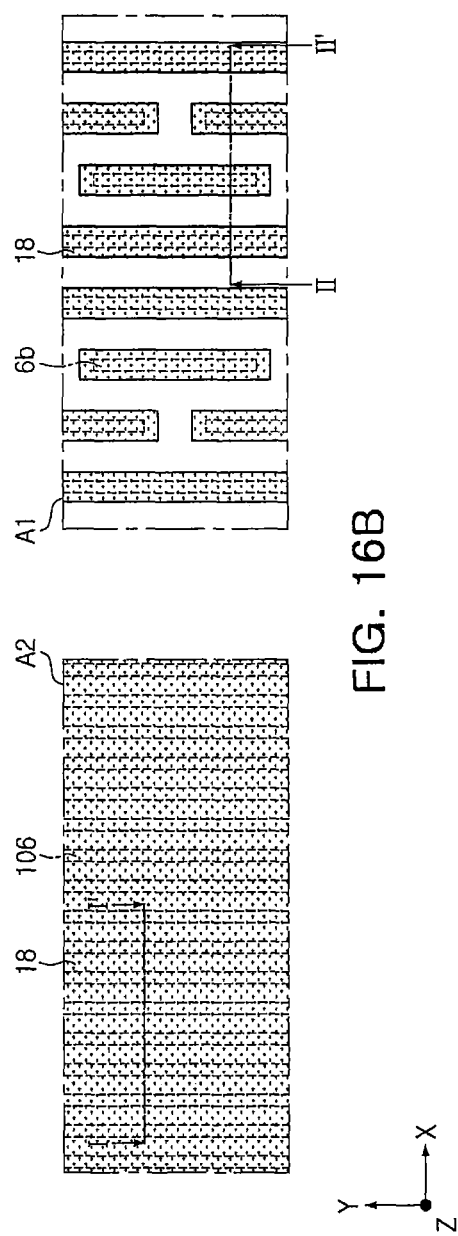

In a modified example, as illustrated in FIG. 16B, in the first photoresist pattern 18, a portion 18 thereof, formed on the first region A1, may be modified to have partially cut linear shapes. The first photoresist pattern 18 modified as illustrated in FIG. 16B may be used as a photoresist pattern for formation of the connecting portion 25 described above with reference to FIGS. 10 and 11A.

Figure 18A:
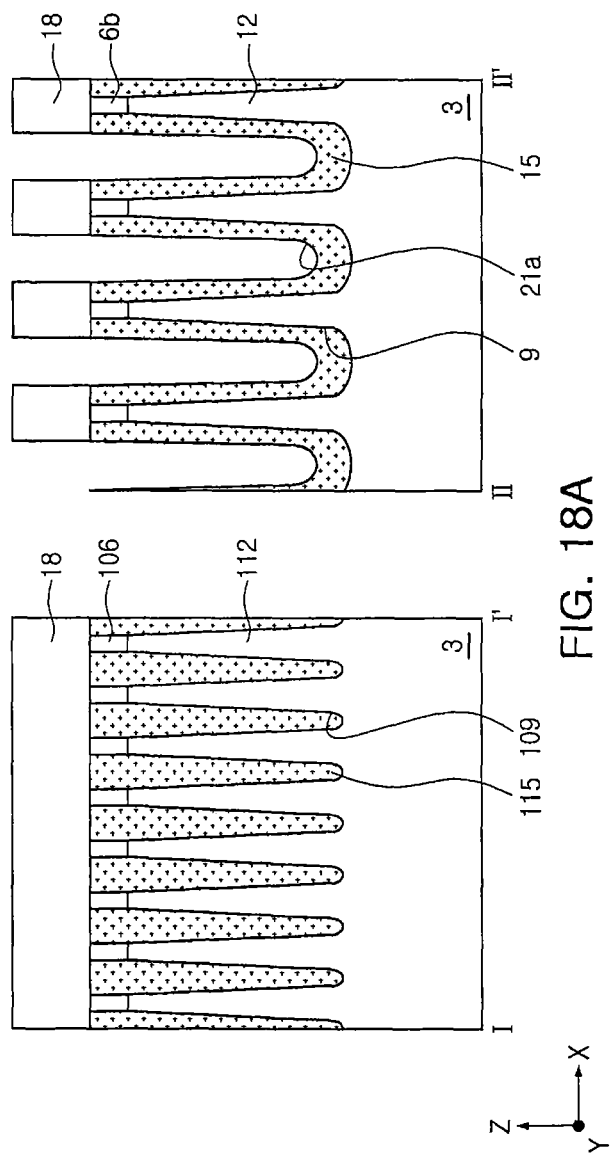

Referring to FIG. 18A, the first preliminary isolation region 15 in the first region A1 may be partially etched by performing an etching process of using the first photoresist pattern 18 as an etching mask. Thus, grooves 21a may be formed in the first preliminary isolation region 15 in the first region A1. The grooves 21a may be located on levels higher than bottom surfaces of the first trenches 9.

Figure 18B:
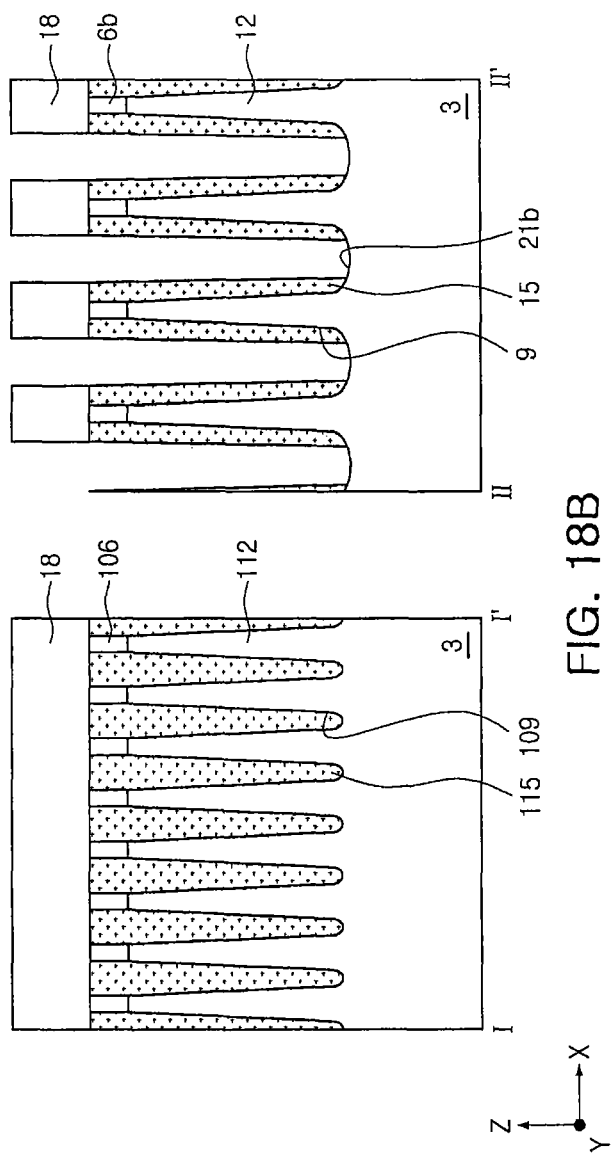

In a modified example, as illustrated in FIG. 18B, an etching process using the first photoresist pattern 18 as an etching mask may be performed to form grooves 21b penetrating through the first preliminary isolation region 15 of the first region A1 and exposing the substrate 3.

Figure 18C:
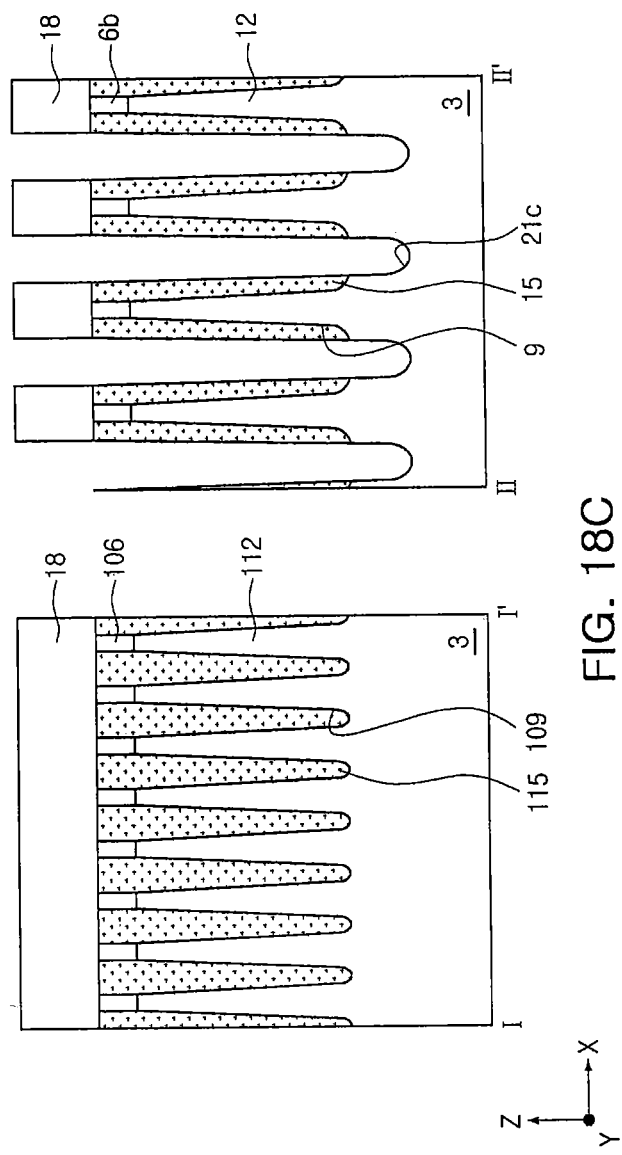

In another modification, as illustrated in FIG. 18C, an etching process using the first photoresist pattern 18 as an etching mask may be performed to form grooves 21c, penetrating through the first preliminary isolation region 15 of the first region A1 and extending into the substrate 3.

Hereinafter, the substrate having the grooves 21a as illustrated in FIG. 18A will be described, rather than the substrate having the grooves 21b and 21c as illustrated in FIGS. 18B and 18C. The substrate having the grooves 21a as illustrated in FIG. 18A, to be described below, may also be replaced with the substrates having the grooves 21b and 21c as illustrated in FIGS. 18B and 18C. Thus, although descriptions below will be centered on the substrate having the grooves 21a described above with reference to FIG. 18A, the substrate may be replaced with substrates having the grooves 21b and 21c as illustrated in FIGS. 18B and 18C.

Figure 19:
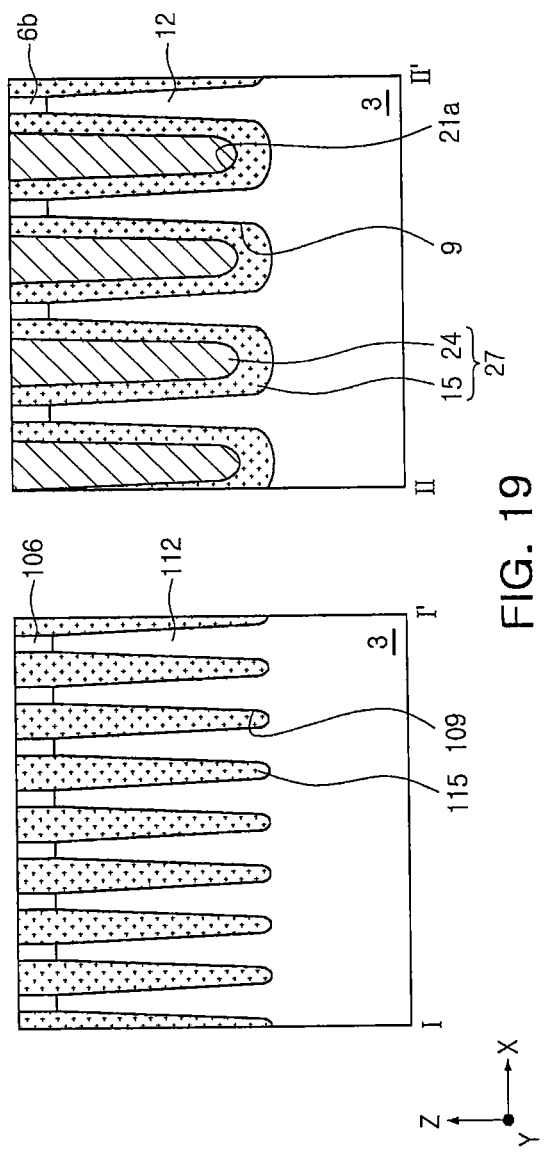

Referring to FIG. 19, after removing the first photoresist pattern 18, a second insulating material may be deposited on the substrate having the grooves 21a, and the second insulating material may be planarized until the hard masks 6b and 106 are exposed, thereby forming the first isolation region 27.

In example embodiments, the first preliminary isolation region 15 may be referred to as a first portion 15 of the first isolation region 27, and the second insulating material filling the grooves 21a may be referred to as a second portion 24 of the first isolation region 27.

Figure 20:
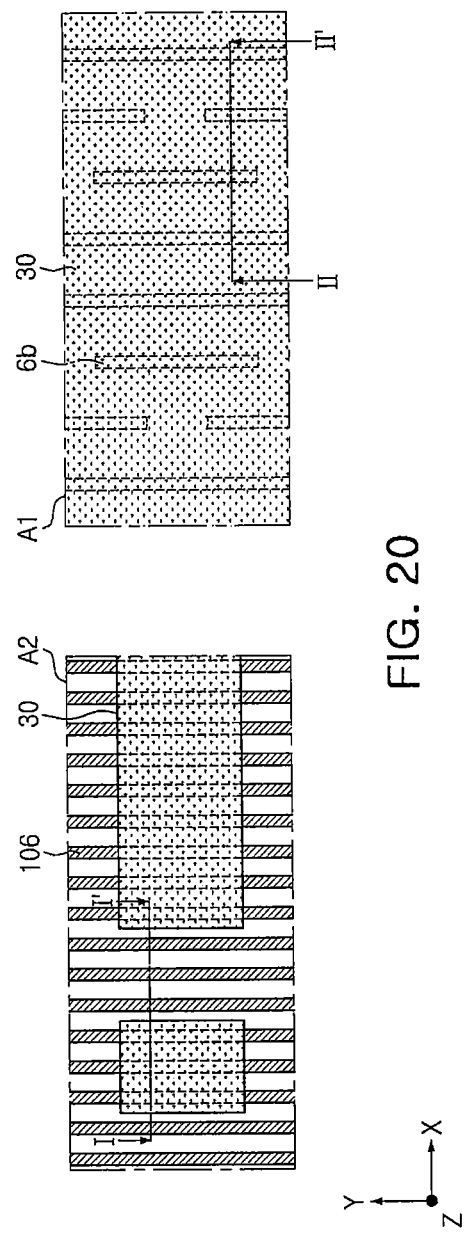
Figure 21A:
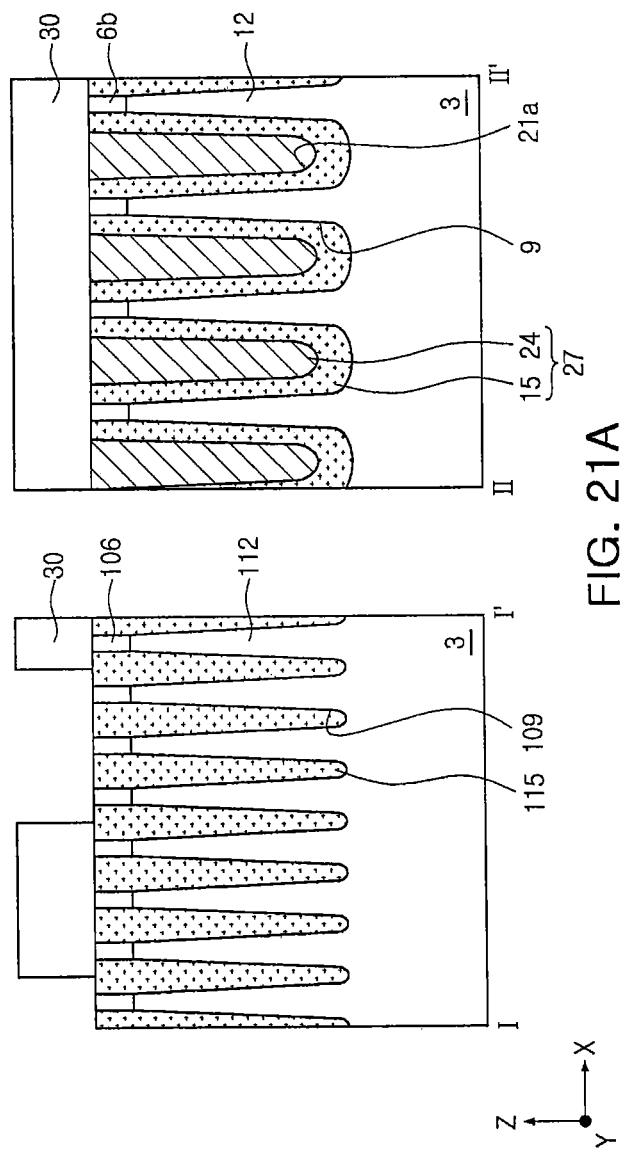

Referring to FIGS. 20 and 21A, a second photoresist pattern 30 may be formed on a substrate having the first isolation region 27 and the second isolation region 115. The second photoresist pattern 30 may cover the entirety of the first region A1 and/or cover a portion of the second region A2.

Figure 21B:
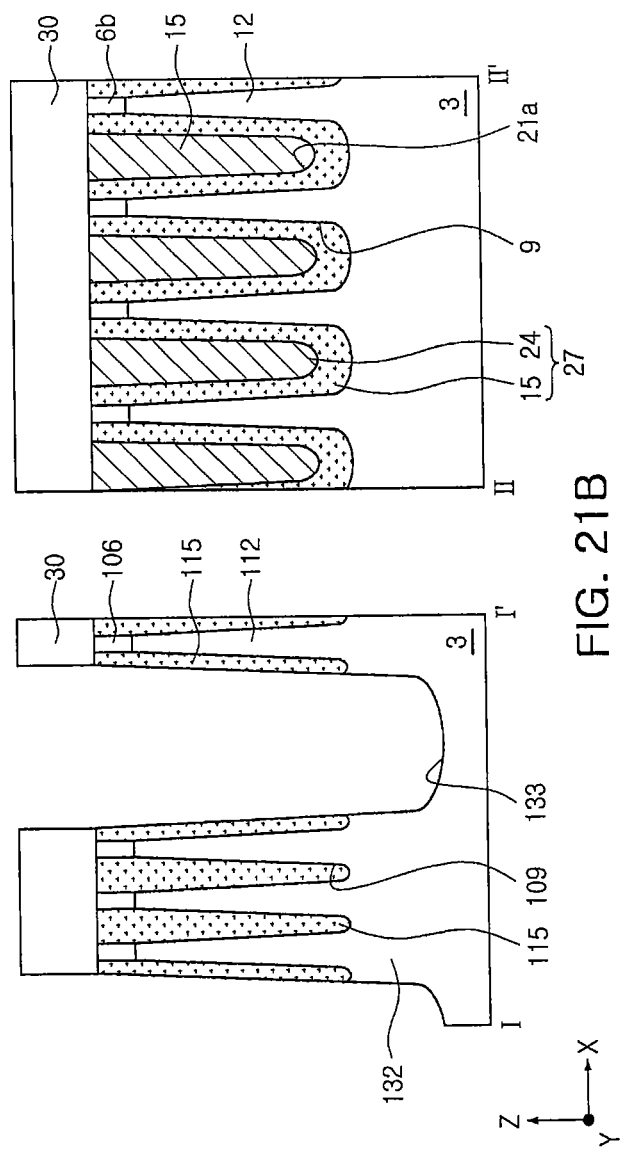

With reference to FIG. 21B, an etching process using the second photoresist pattern 30 as an etching mask may be performed to etch the second isolation region 115 and the second active regions 112 on the second region A2, thereby forming a third trench 133. The third trench 133 may have a bottom surface deeper than bottoms of the first and second trenches 9 and 109. An active base region 132, defined by the third trench 133, may be formed. The second active regions 112 may remain on the active base region 132.

Figure 22:
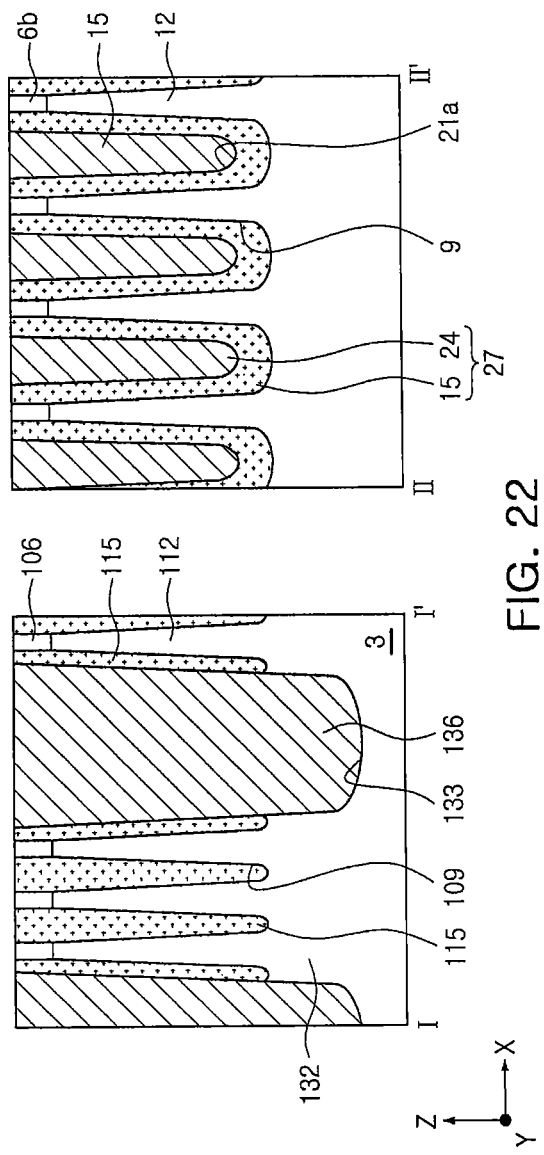

Referring to FIG. 22 together with FIG. 1A, after the second photoresist pattern 30 is removed, a third isolation region 136 may be formed to fill the third trench 133. The third isolation region 136 may be formed of a third insulating material.

Figure 23:
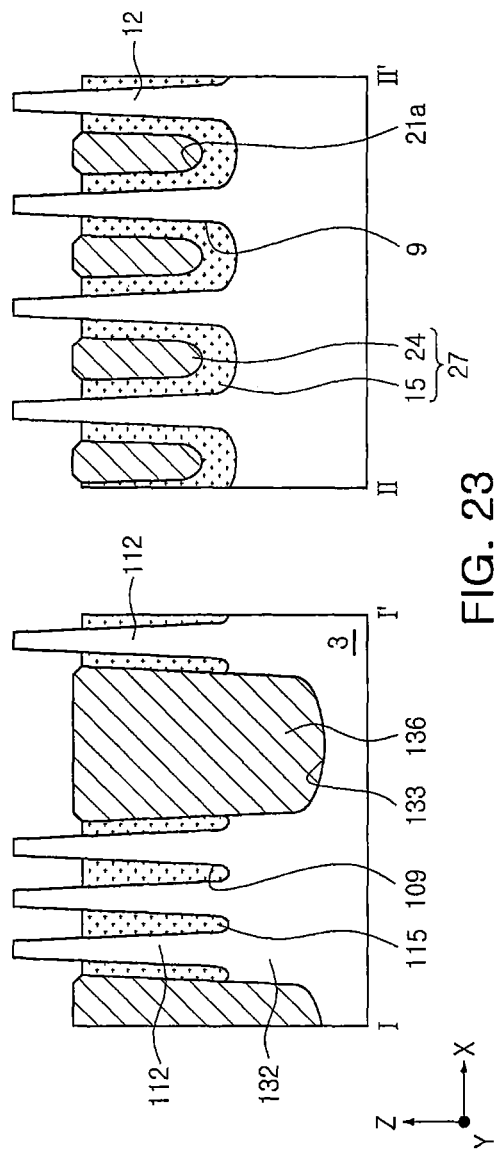

Referring to FIG. 23, after the first and second hard masks 6b and 106 are removed, the first to third isolation regions 27, 115 and 136 may be etched back to expose upper regions of the first and second active regions 12 and 122. Thus, the upper regions of the first and second active regions 12 and 112 may form exposed fins.

Referring again to FIGS. 1A, 1B, 2A and 2B, a transistor formation process may be performed with respect to a substrate having the first and second active regions 12 and 112, and the first to third isolation regions 27, 115 and 136. In an example, the transistor formation process may include forming a sacrificial gate structure overlapping the first and second active regions 12 and 112, forming gate spacers on sides of the sacrificial gate structure, forming a recessed region by etching the first and second active regions 12 and 112 adjacent to the sacrificial gate structure, growing an epitaxial layer from the recessed region to be doped to form source/drain regions, removing the sacrificial gate structure, and forming a gate dielectric, a gate electrode, and a gate capping pattern in a space from which the sacrificial gate structure has been removed.

Thus, in the first region A1, first gate structures 240 extending in a first direction X and having a portion overlapping the first active regions 12, and first source/drain regions 210 connected to the first active regions 12 positioned adjacent to the first gate structures 240, may be formed. In the second region A2, second gate structures 340 extending in the first direction X and having a portion overlapping the second active regions 112, and second source/drain regions 310 connected to the second active regions 112 positioned adjacent to the second gate structures 340, may be formed.

In some embodiments, the first source/drain regions 240 formed on the first region A1 may be spaced apart from each other.

In some embodiments, source/drain regions adjacent to each other, among the second source/drain regions 310 formed on the second region A2, may be connected to each other. Thus, an empty space 308 may be formed between a lower portion of the second source/drain regions 310 connected to each other, and the second isolation region 115.

Figure 24A:
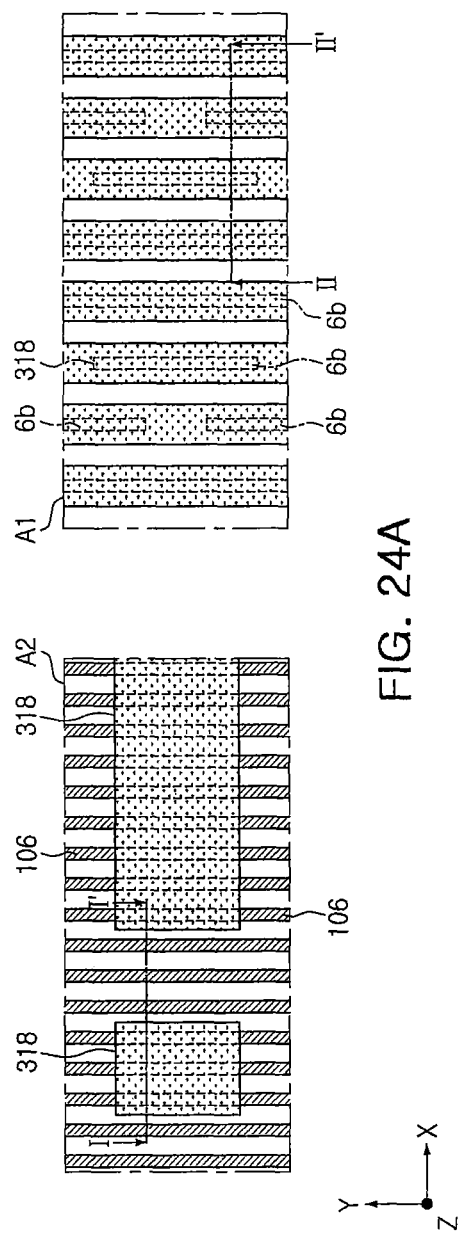
FIGS. 24A to 28 are views of a modified example of the method of forming a semiconductor device, according to some embodiments of the present inventive concept.
Figure 24B:
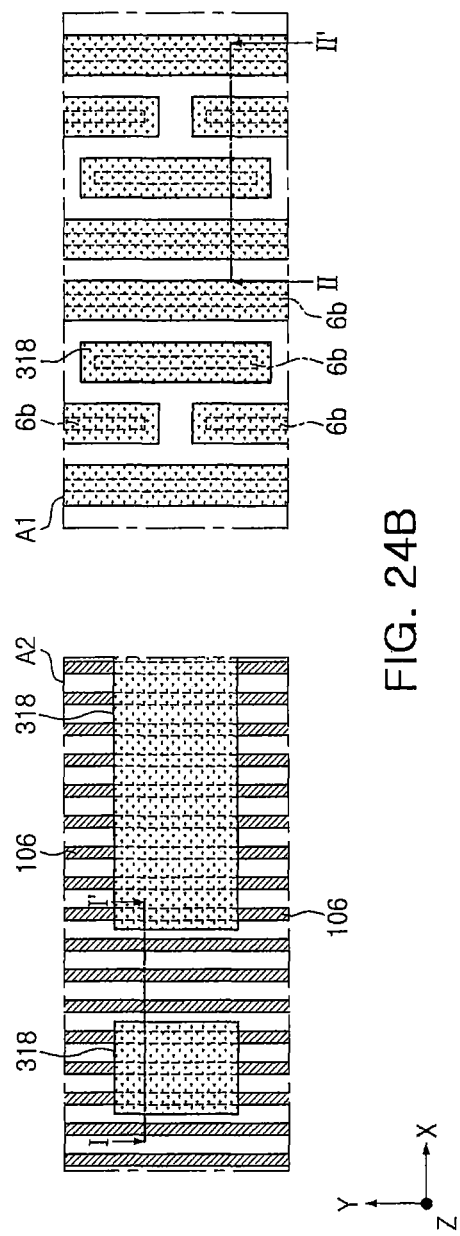

Next, a modified example of the method of forming a semiconductor device according to some embodiments will be described with reference to FIGS. 24A to 28. FIG. 24A is a plan view of a modified example of the method of forming a semiconductor device according to some embodiments, and FIGS. 25 to 28 are cross-sectional views taken along line I-I' and line II-II' of FIG. 24a. FIG. 24B is a plan view of another modification of the method of forming a semiconductor device according to an example embodiment.

Figure 25:
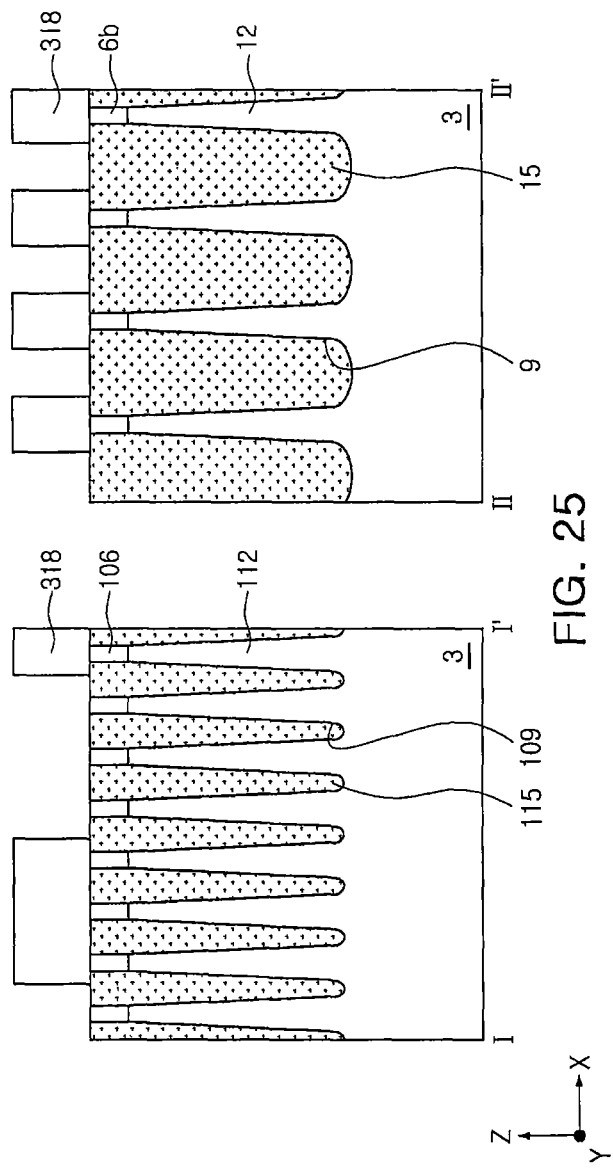

Referring to FIGS. 24A and 25, a substrate formed up to the first and second trenches (see 9 and 109 of FIG. 15) described with reference to FIGS. 14 and 15 may be prepared. Subsequently, a first preliminary isolation region 15 may be formed to fill the first trench 9, and a second isolation region 115 may be formed to fill the second trench 109. The first preliminary isolation region 15 and the second isolation region 115 may be formed of a first insulating material.

A photoresist pattern 318 may be formed on the substrate 3 on which the first preliminary isolation region 15 and the second isolation region 115 have been formed.

In the first region A1, the photoresist pattern 318 may be formed to have the same shape and size as those of the first photoresist pattern (see 18 of FIGS. 16A and 17) of the first region A1, described above with reference to FIGS. 16A and 17.

In the second region A2, the photoresist pattern 318 may be formed to have the same shape and size as those of the second photoresist pattern (see FIGS. 20 and 21A) of the second region A2, described above with reference to FIGS. 20 and 21A.

In a modified example, as illustrated in FIG. 24B, the photoresist pattern 318 in the first region A1 may be formed to have the same shape and size as those of the modified first photoresist pattern (see 18 of FIG. 16B) of the first region A1, described above with reference to FIG. 16B.

Figure 26:
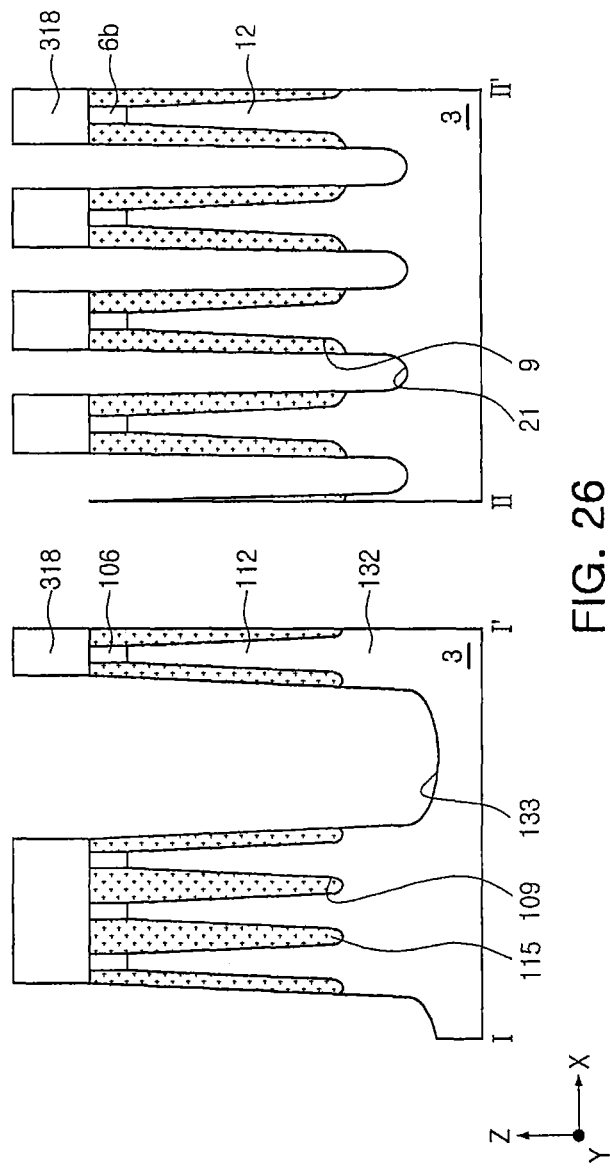

Referring to FIG. 26, an etching process using the photoresist pattern 318 as an etching mask may be performed, to form grooves 21 penetrating through the first preliminary isolation region 15 in the first region A1 and extending into the substrate 3, and to also form a third trench 133 in the second region A2. The grooves 21 may have a shape and structure similar to those of the grooves (see 21 of FIG. 18C)

described above with reference to FIG. 18C. The third trench 133 may have a shape and structure similar to those of the third trench (see 133 of FIG. 21B) described above with reference to FIG. 21B.

Figure 27:
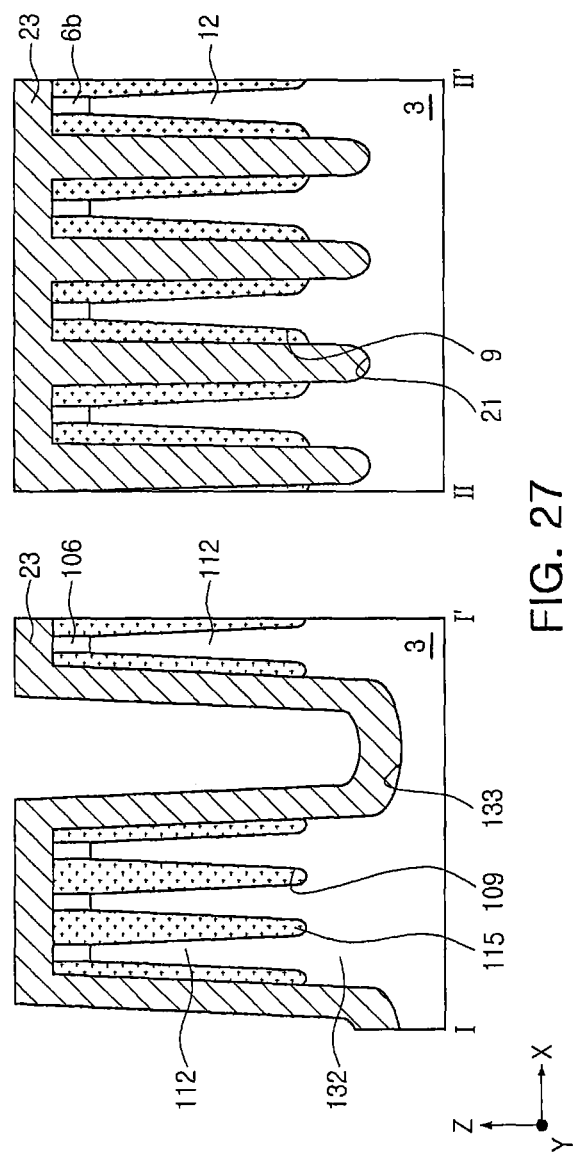

Referring to FIG. 27, the photoresist pattern 318 may be removed. Then, a second insulating material layer 23 may be formed to fill the grooves 21 and conformally cover an inner wall of the third trench 133.

Figure 28:
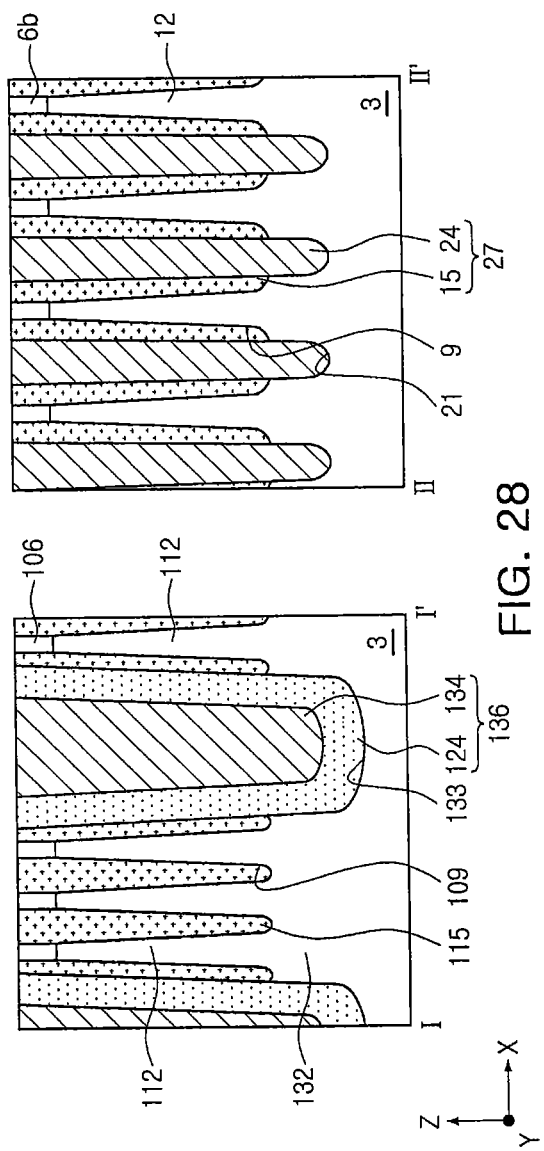

Referring to FIG. 28, a third insulating material layer may be formed on the substrate having the second insulating material layer 23, to fill a remaining portion of the third trench 133, and the third insulating material layer and the second insulating material layer (see 23 of FIG. 27) may be planarized until the first and second hard masks 6b and 106 are exposed.

In the first region A1, the second insulating material layer (see 23 of FIG. 27) may remain to be formed as a second portion 24 of the first isolation region 27. The first preliminary isolation region 15 remaining in the first region A1 may be referred to as a first portion 15 of the first isolation region 27.

In the second region A2, the second insulating material layer 23 (see FIG. 27) may remain to be formed as a first portion 124 of a third isolation region 136, and the third insulating material layer may remain to be formed as a second portion 134 of the third isolation region 136.

Then, after the process of etching back the first to third isolation regions 27, 115 and 136 as described above with reference to FIG. 23 is performed, the transistor formation process may be performed.

Figure 29A:
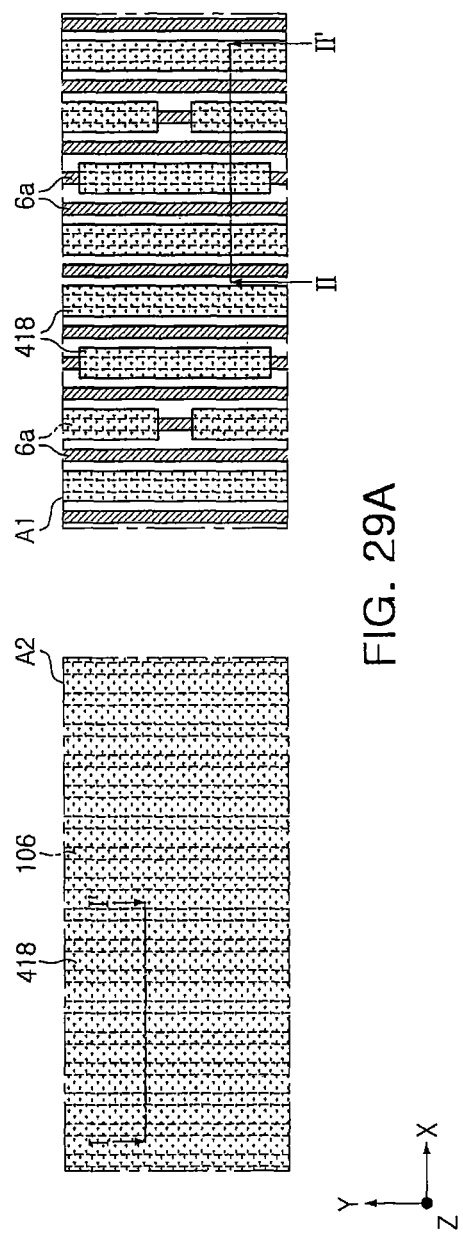
FIGS. 29A to 32 are views of a modified example of the method of forming a semiconductor device, according to some embodiments of the present inventive concept.
Figure 29B:
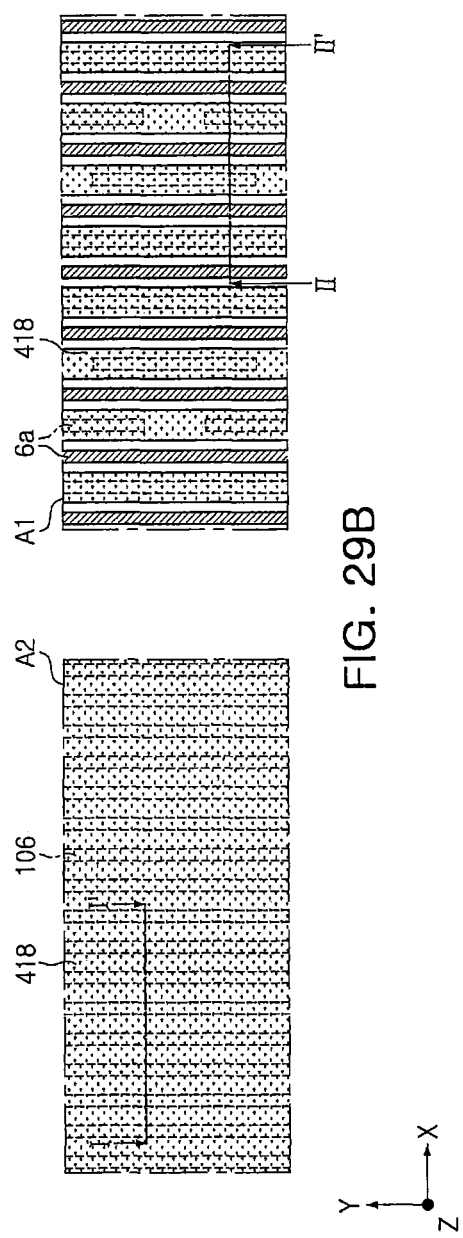
Figure 30:
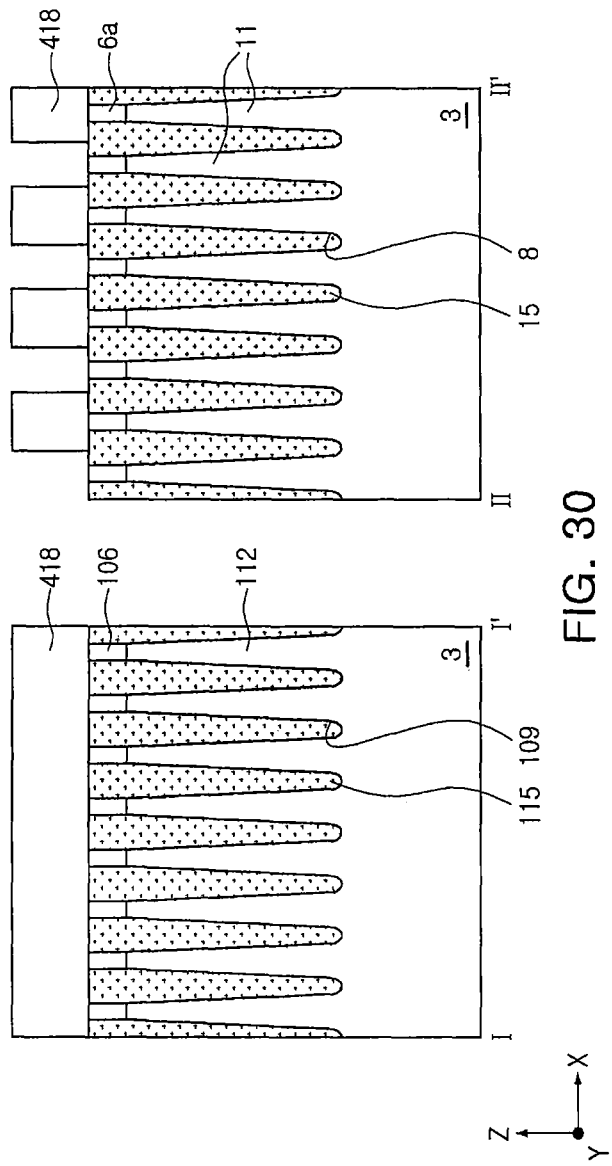
Figure 31B:
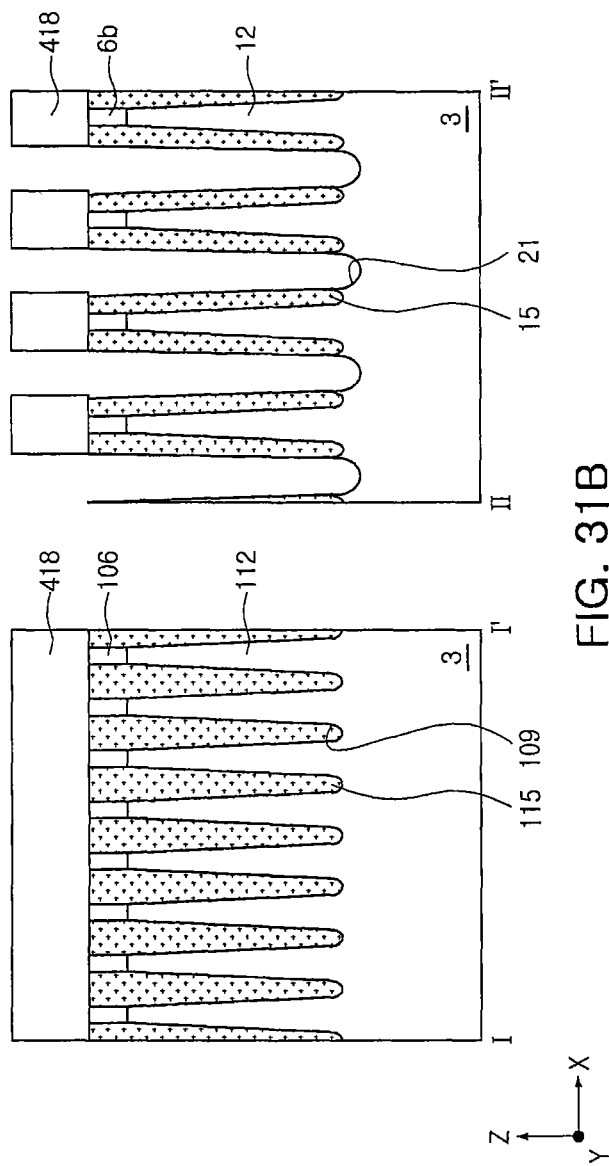
Figure 32:
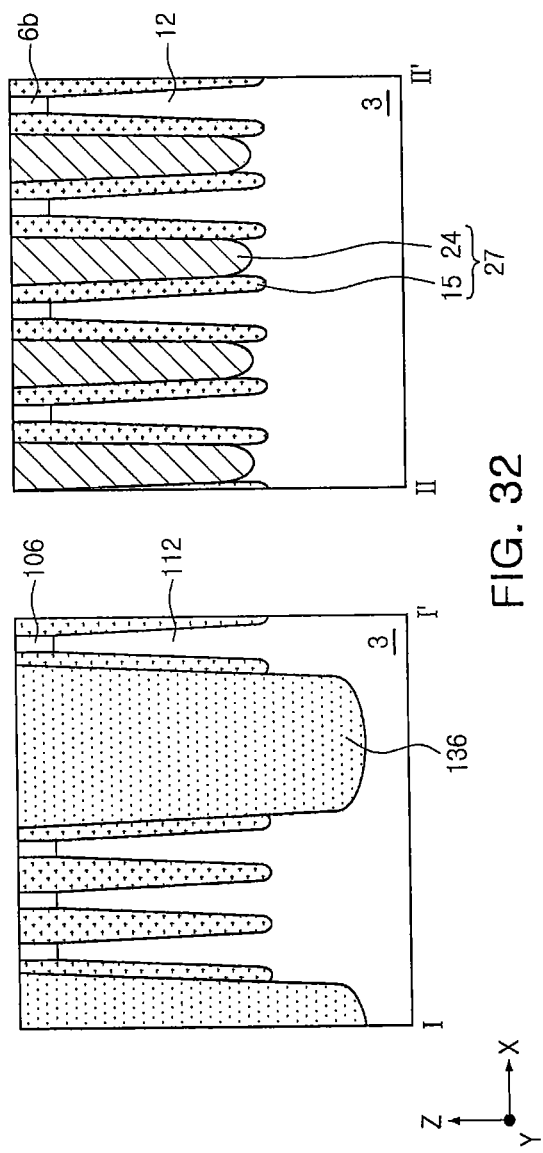

Next, a modified example of the method of forming a semiconductor device according to some embodiments will be described with reference to FIGS. 29A to 32. FIG. 29A is a plan view of a modified example of the method of forming a semiconductor device according to some embodiments, and FIGS. 30, 31A and 32 are cross-sectional views of regions taken along lines I-I' and II-II' of FIG. 29A. FIG. 29B is a plan view of another modification of the method of forming a semiconductor device according to some embodiments. FIG. 31B is a cross-sectional view of another modification of the method of forming a semiconductor device according to some embodiments.

Referring to FIGS. 29A and 30, a substrate 3 formed up to the same first and second hard masks 6a and 106 as those described above with respect to FIGS. 12 and 13 may be prepared.

An etching process using the first and second hard masks 6a and 106 as etching masks may be performed to etch the substrate 3, to form first preliminary trenches 8 in the first region A1 and to form second trenches 109 in the second region A2.

First preliminary isolation regions 15 may be formed to fill the first preliminary trenches 8, and second isolation regions 115 may be formed to fill the second trenches 109.

The first preliminary isolation regions 15 may define first preliminary active regions 11, and the second isolation regions 115 may define second active regions 112.

A photoresist pattern 418 may be formed on the substrate having the first preliminary isolation regions 15 and the second isolation regions 115.

The photoresist pattern 418 may expose a portion of the first region A1 while covering the entirety of the second region A2. A portion of the first hard masks 6a and a portion of the first preliminary isolation regions 15 may be exposed by the photoresist pattern 418.

In a modified example, the first hard masks 6a may have a shape in which a portion thereof is patterned, as illustrated in FIG. 29B. For example, in the case of the first hard masks 6a that may have linear shapes, arranged to have a constant interval therebetween in the first direction X and extending in the first direction X, a portion of the first hard masks 6a may be patterned and removed in a second direction Y perpendicular to the first direction X. A photoresist pattern 418 may be formed on the first hard masks 6a modified as described above, as illustrated in FIG. 29B. The photoresist pattern 418 in FIG. 29B may be formed to have the same shape and size as those of the first photoresist pattern (see 18 of FIG. 16A) in the first region A1 described above with reference to FIG. 16A and FIG. 17.

Referring to FIG. 31A, an etching process using the photoresist pattern 418 as an etching mask may be performed, to etch a portion of the first preliminary isolation regions 15, a portion of the first hard masks 6a, and a portion of the first preliminary active regions 11, and thus form the grooves 21.

The first preliminary active regions remaining after forming the grooves 21 may be defined as first active regions 12. An interval between the first active regions 12 may be greater than an interval between the first preliminary active regions (see 11 of FIG. 30). The first hard masks 6b may remain on the first active regions 12.

In an example embodiment, bottom surfaces of the grooves 21 may be disposed to be higher than bottom surfaces of the first preliminary isolation regions 15, but the technical idea thereof is not limited thereto. For example, as illustrated in FIG. 31B, the grooves 21 may be modified, to extend into the substrate 3 and have bottom surfaces lower than bottom surfaces of the first preliminary isolation regions 15.

Referring to FIG. 32, after the photoresist pattern 418 is removed, a second insulating material may be deposited on the substrate having the grooves 21, in the same manner as described above with reference to FIG. 19, and the second insulating material may be planarized until the first and second hard masks 6b and 106 are exposed, to form the first isolation region 27. As illustrated in FIG. 19, the first preliminary isolation region 15 may be referred to as a first portion 15 of the first isolation region 27, and the second insulating material filling the grooves 21a may be referred to as a second portion 24 of the first isolation region 27.

Then, the third isolation region 136, the same as that illustrated in FIG. 22, may be formed in the second region A2 by performing the same process as described above with reference to FIGS. 20 to 22.

Subsequently, after the process of etching back the first to third isolation regions 27, 115 and 136 as described above with reference to FIG. 23 is performed, the transistor formation process may be performed.

Figure 33:
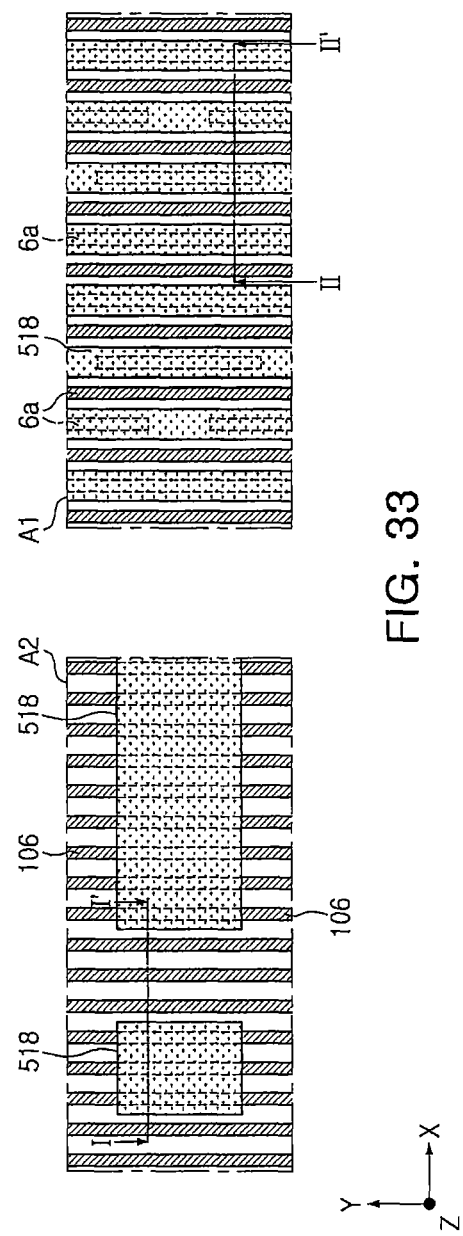
FIGS. 33 to 37 are views of a modified example of the method of forming a semiconductor device, according to some embodiments of the present inventive concept.
Figure 34:
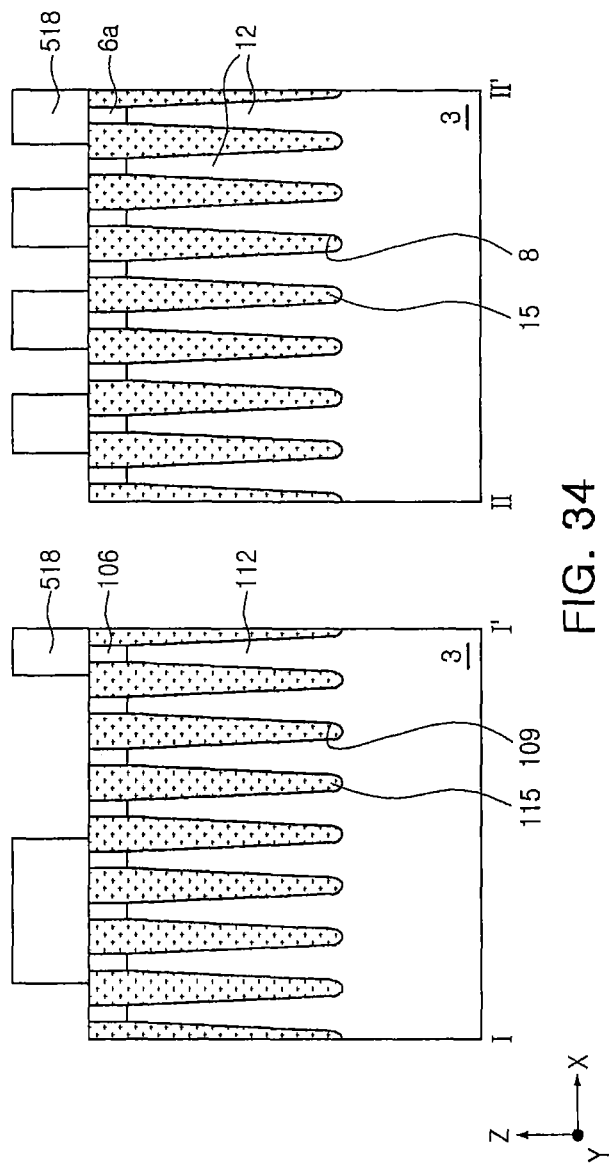

Next, a modified example of the method of forming a semiconductor device according to some embodiments will be described with reference to FIGS. 33 to 37. FIG. 33 is a plan view of a modified example of the method of forming a semiconductor device according to some embodiments, and FIGS. 34 to 37 are cross-sectional views of regions taken along lines I-I' and of FIG. 33.

Figure 37:
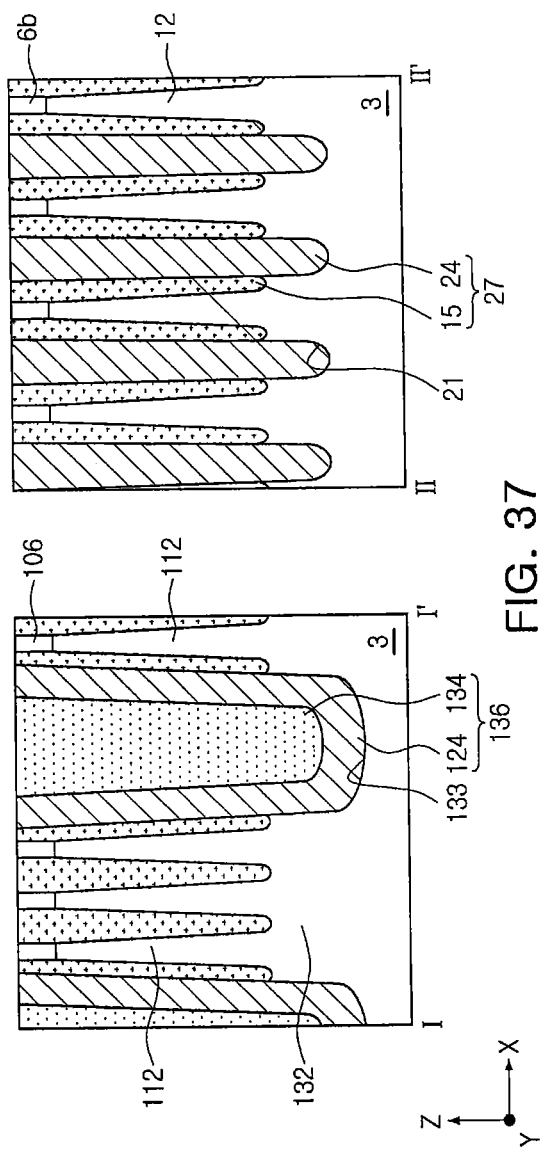

Referring to FIGS. 33 and 37, a substrate 3 formed up to the first preliminary isolation regions 15 defining the first preliminary active regions 11, and the second isolation regions 115 defining the second active regions 112, identical to those described above with reference to FIGS. 29A and 30, may be prepared. The first hard masks 6a may remain on the first preliminary active regions 11, and the second hard masks 106 may remain on the second active regions 112.

A photoresist pattern 518 may be formed on the substrate having the first preliminary isolation regions 15 and the second isolation regions 115.

The photoresist pattern 518 may expose a portion of the second region A2 and a portion of the first region A1. A portion of the first hard masks 6a and a portion of the first preliminary isolation regions 15 may be exposed by the photoresist pattern 518. The photoresist pattern 518 may have the same shape and size as the photoresist pattern 318 described above with reference to FIGS. 24A and 25.

Figure 35:
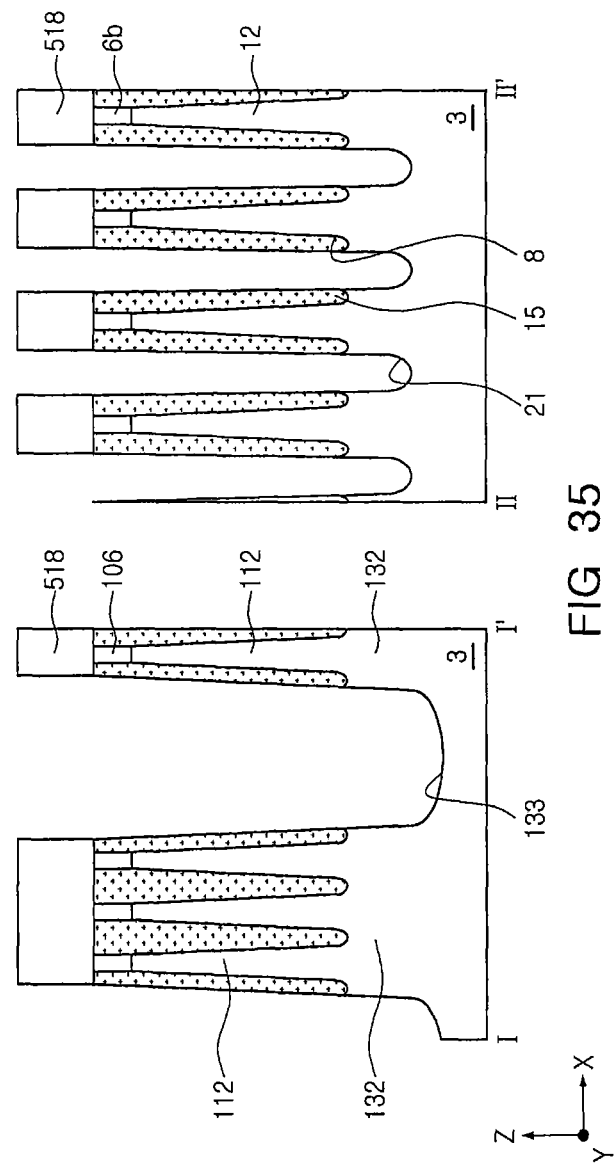

Referring to FIG. 35, an etching process using the photoresist pattern 518 as an etching mask may be performed to form grooves 21 and a third trench 133, identical to those described above with reference to FIG. 26.

Figure 36:
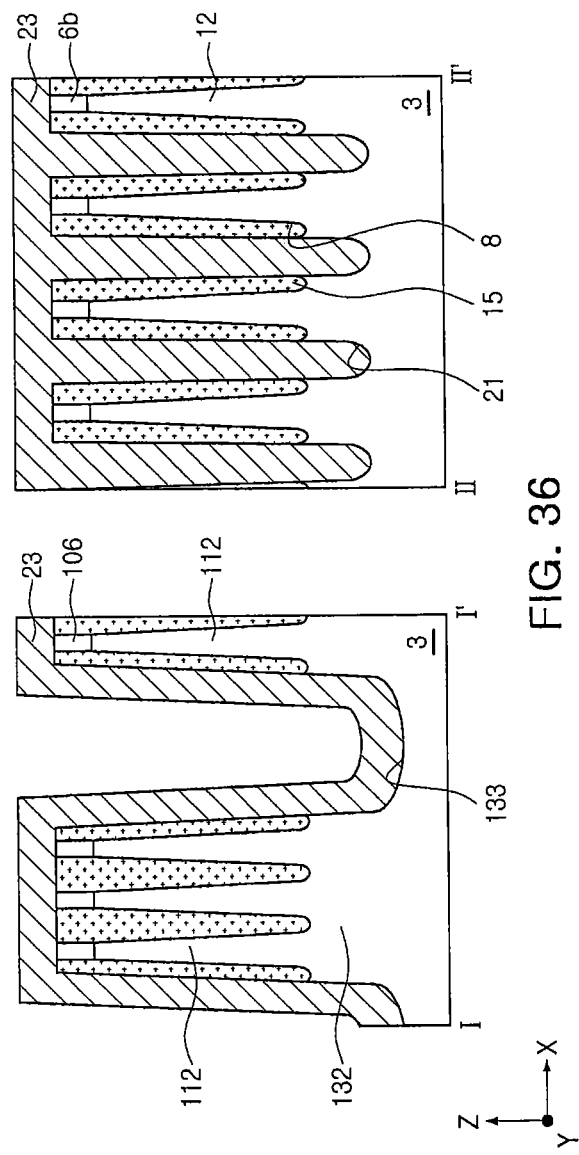

Referring to FIG. 36, after the photoresist pattern 518 is removed, a second insulating material layer 23, covering the grooves 21 and conformally covering an inner wall of the third trench 133, may be formed in the same manner as that described above with reference to FIG. 27.

Referring to FIG. 37, in the same manner as that described above with reference to FIG. 28, a third insulating material layer may be formed on the substrate having the second insulating material layer 23, to fill a remaining portion of the third trench 133, and the third insulating material layer and the second insulating material layer (see 23 of FIG. 36) may be planarized until the first and second hard masks 6b and 106 are exposed. In the first region A1, the second insulating material layer (see 23 of FIG. 36) may remain to be formed as a second portion 24 of the first isolation region 27. The first preliminary isolation region 15 remaining in the first region A1 may be referred to as a first portion 15 of the first isolation region 27. In the second region A2, the second insulating material layer 23 (see FIG. 36) may remain to be formed as a first portion 124 of the third isolation region 136, and the third insulating material layer may remain to be formed as a second portion 134 of the third isolation region 136.

Then, after the process of etching back the first to third isolation regions 27, 115 and 136 in the same manner as that described with reference to FIG. 23 is performed, the transistor formation process may be performed.

As set forth above, according to example embodiments, a first isolation region may be formed between first active regions spaced apart from each other by a first distance, and a second isolation region may be formed between second active regions spaced apart from each other by a second distance, shorter than the first distance. The first isolation region and the second isolation region may commonly include a first insulating material, and the first isolation region may further include a second insulating material. The second insulating material may be a material having relatively low thermal degeneration, as compared with that of the first insulating material. Thus, the second insulating material may reduce thermal degeneration of the first isolation region, thereby preventing occurrence of defects such as cracks or the like in the first active regions.

As used herein, the term "and/or" includes any and all combinations of one or m ore of the associated listed items. Expressions such as "at least one of," when preceding a list of elements, modify the entire list of elements and do not modify the individual elements of the list. While example embodiments have been shown and described above, it will be apparent to those skilled in the art that modifications and variations could be made without departing from the scope of the present inventive concept as defined by the appended claims.

What is claimed is:

1. A semiconductor device comprising:
 a substrate;
 a first active region on the substrate and having a first side surface;
 a second active region on the substrate and having a second side surface facing the first side surface; and
 an isolation region between the first side surface of the first active region and the second side surface of the second active region,
 wherein the isolation region includes:
  a first isolation portion that contacts the first side surface of the first active region;
  a second isolation portion that contacts the second side surface of the second active region; and
  a third isolation portion between the first isolation portion and the second isolation portion, and
 wherein a lower end of the first isolation portion and a lower end of the second isolation portion are at a lower level than a third lower end of the third isolation portion.

2. The semiconductor device of claim 1, wherein the first isolation portion and the second isolation portion include a first insulating material, and
 wherein the third isolation portion includes a second insulating material different from the first insulating material.

3. The semiconductor device of claim 1, wherein at least one of a bottom surface of the first isolation portion and a bottom surface of the second isolation portion is downwardly convex, and wherein a bottom surface of the third isolation portion is downwardly convex.

4. The semiconductor device of claim 1,
 wherein each of the first and second active regions has a bar shape that extends in a first direction,
 wherein a width in a second direction of the third isolation portion is different from respective widths in the second direction of each of the first and second isolation portions, and
 wherein the second direction is perpendicular to the first direction.

5. The semiconductor device of claim 1,
 wherein each of the first and second active regions has a bar shape that extends in a first direction,
 wherein a width in a second direction of the third isolation portion is greater than respective widths in the second direction of each of the first and second isolation portions, and
 wherein the second direction is perpendicular to the first direction.

6. The semiconductor device of claim 1,
 wherein each of the first and second active regions has a bar shape that extends in a first direction,
 wherein a width in a second direction of the isolation region is greater than respective widths of each of the first and second active regions, and
 wherein the second direction is perpendicular to the first direction.

7. The semiconductor device of claim 1, wherein the second active region contacts the third isolation portion and the second isolation portion.

8. The semiconductor device of claim 1, further comprising:
 a first source/drain epitaxial layer on the first active region; and
 a second source/drain epitaxial layer on the second active region.

9. The semiconductor device of claim 8, further comprising:
   an interlayer insulating layer on the first and second source/drain epitaxial layers and the isolation region;
   a first contact plug that penetrates the interlayer insulating layer and contacts the first source/drain epitaxial layer; and
   a second contact plug that penetrates the interlayer insulating layer and contacts the second source/drain epitaxial layer.

10. A semiconductor device comprising:
   a semiconductor substrate;
   a first active region on the semiconductor substrate and having a first side surface;
   a second active region on the semiconductor substrate and having a second side surface facing the first side surface;
   an isolation region on the semiconductor substrate and between the first side surface of the first active region and the second side surface of the second active region; and
   a first protrusion that protrudes from the semiconductor substrate,
   wherein the isolation region includes:
      a first isolation portion that contacts the first side surface of the first active region;
      a second isolation portion that contacts the second side surface of the second active region; and
      a third isolation portion between the first isolation portion and the second isolation portion, and
   wherein the first protrusion extends between the first isolation portion and the third isolation portion.

11. The semiconductor device of claim 10, wherein a lower end of the third isolation portion is at a different level than a lower end of the first isolation portion and a lower end of the second isolation portion.

12. The semiconductor device of claim 10, wherein a lower end of the third isolation portion is at a higher level than a lower end of the first isolation portion and a lower end of the second isolation portion.

13. The semiconductor device of claim 10, wherein the first isolation portion and the second isolation portion include a first insulating material, and
   wherein the third isolation portion includes a second insulating material different from the first insulating material.

14. The semiconductor device of claim 10, further comprising:
   a second protrusion that protrudes from the semiconductor substrate and extends between the second isolation portion and the third isolation portion.

15. The semiconductor device of claim 10, wherein at least one of a bottom surface of the first isolation portion and a bottom surface of the second isolation portion is downwardly convex, and
   wherein a bottom surface of the third isolation portion is downwardly convex.

16. A semiconductor device comprising:
   a semiconductor substrate including a first circuit region and a second circuit region;
   a first active region on the first circuit region of the semiconductor substrate and having a first side surface;
   a second active region on the first circuit region of the semiconductor substrate and having a second side surface facing the first side surface;
   a third active region on the second circuit region of the semiconductor substrate and having a third side surface;
   a fourth active region on the second circuit region of the semiconductor substrate and having a fourth side surface;
   a first isolation region on the first circuit region of the semiconductor substrate and between the first side surface of the first active region and the second side surface of the second active region; and
   a second isolation region on the second circuit region of the semiconductor substrate and between the third side surface of the third active region and the third side surface of the second active region,
   wherein the first isolation region includes:
      a first isolation portion that contacts the first side surface of the first active region;
      a second isolation portion that contacts the second side surface of the second active region; and
      a third isolation portion between the first isolation portion and the second isolation portion,
   wherein the second isolation region includes:
      a fourth isolation portion;
      a fifth isolation portion between the fourth isolation portion and the third side surface of the third active region; and
      a sixth isolation portion between the fourth isolation portion and the fourth side surface of the fourth active region,
   wherein a lower end of the third isolation portion is at a higher level than a lower end of the first isolation portion and a lower end of the second isolation portion, and
   wherein a lower end of the fourth isolation portion is at a lower level than a lower end of the fifth isolation portion and a lower end of the sixth isolation portion.

17. The semiconductor device of claim 16, wherein the lower end of the fourth isolation portion is at a lower level than the lower end of the first isolation portion and the lower end of the second isolation portion.

18. The semiconductor device of claim 16, wherein a width of the fourth isolation portion is greater than a width of the third isolation portion.

19. The semiconductor device of claim 16, wherein the first isolation portion and the second isolation portion include a first insulating material, and
   wherein the third isolation portion includes a second insulating material different from the first insulating material.

20. The semiconductor device of claim 16, further comprising:
   a protrusion that protrudes from the semiconductor substrate and extends between the first isolation portion and the third isolation portion.

* * * * *